US010535798B2

(12) United States Patent
Jeon et al.

(10) Patent No.: US 10,535,798 B2
(45) Date of Patent: *Jan. 14, 2020

(54) SEMICONDUCTOR LIGHT EMITTING DEVICE COMPRISING FINGER ELECTRODES

(71) Applicant: SEMICON LIGHT CO., LTD., Gyeonggi-do (KR)

(72) Inventors: Soo Kun Jeon, Gyeonggi-do (KR); Eun Hyun Park, Gyeonggi-do (KR); Yong Deok Kim, Gyeonggi-do (KR)

(73) Assignee: SEMICON LIGHT CO., LTD., Gyeonggi-do (KR)

( * ) Notice: Subject to any disclaimer, the term of this patent is extended or adjusted under 35 U.S.C. 154(b) by 11 days.

This patent is subject to a terminal disclaimer.

(21) Appl. No.: 14/118,599

(22) PCT Filed: Jul. 18, 2013

(86) PCT No.: PCT/KR2013/006458
§ 371 (c)(1),
(2) Date: Apr. 8, 2014

(87) PCT Pub. No.: WO2014/014299
PCT Pub. Date: Jan. 23, 2014

(65) Prior Publication Data
US 2014/0291714 A1    Oct. 2, 2014

(30) Foreign Application Priority Data

Jul. 18, 2012  (KR) .................. 10-2012-0078270
Jul. 30, 2012  (KR) .................. 10-2012-0083091
Jan. 10, 2013  (KR) .................. 10-2013-0002949

(51) Int. Cl.
H01L 33/10    (2010.01)
H01L 33/38    (2010.01)
H01L 33/46    (2010.01)

(52) U.S. Cl.
CPC ............ *H01L 33/10* (2013.01); *H01L 33/387* (2013.01); *H01L 33/38* (2013.01); *H01L 33/382* (2013.01); *H01L 33/46* (2013.01)

(58) Field of Classification Search
CPC ....... H01L 33/10; H01L 33/38; H01L 33/382; H01L 33/387; H01L 33/46
See application file for complete search history.

(56) References Cited

U.S. PATENT DOCUMENTS 7,262,436 B2    8/2007  Kondoh et al.
8,357,949 B2    1/2013  Kim et al.
(Continued)

FOREIGN PATENT DOCUMENTS

JP    11-074559    3/1999
JP    2006-120913  5/2006
(Continued)

OTHER PUBLICATIONS

International Search Report for PCT International Application No. PCT/KR2013/006457 (published Jan. 23, 2014 as WO2014/014298) dated Nov. 22, 2013; 5 pgs.
(Continued)

Primary Examiner — Mohsen Ahmadi
Assistant Examiner — Christopher M Roland
(74) Attorney, Agent, or Firm — Harness, Dickey & Pierce, P.L.C.

(57) ABSTRACT

The present disclosure relates to a semiconductor light emitting device, comprising: a plurality of semiconductor layers that grows sequentially on a growth substrate, with the plurality of semiconductor layers including a first semiconductor layer having a first conductivity, a second semiconductor layer having a second conductivity different from the first conductivity, and an active layer interposed between the first semiconductor layer and the second semiconductor (Continued)

layer, generating a light with a first wavelength via electron-hole recombination; a first electrode, supplying either electrons or holes to the plurality of semiconductor layers; a second electrode, supplying, to the plurality of semiconductor layers, electrons if the holes are supplied by the first electrode, or holes if the electrons are supplied by the first electrode; a phosphor part provided over the first semiconductor layer on the side of the growth substrate, converting the light with the first wavelength generated in the active layer into a light of a second wavelength; and a non-conductive reflective film formed on the second semiconductor layer for reflecting the light from the active layer towards the first semiconductor layer on the side of the growth substrate, with the non-conductive reflective film having a distributed bragg reflector designed based on the light converted by the phosphor part.

4 Claims, 20 Drawing Sheets

(56) References Cited

U.S. PATENT DOCUMENTS

| | | | |
|---|---|---|---|
| 8,373,188 B2 | 2/2013 | Suh et al. | |
| 8,552,447 B2 | 10/2013 | Yahata et al. | |
| 2002/0171087 A1* | 11/2002 | Krames | H01L 33/38 257/81 |
| 2007/0096115 A1 | 5/2007 | Lee et al. | |
| 2010/0314642 A1 | 12/2010 | Kudo et al. | |
| 2011/0114969 A1 | 5/2011 | Lee et al. | |
| 2012/0043575 A1 | 2/2012 | Kim et al. | |
| 2013/0011953 A1 | 1/2013 | Nakajo et al. | |
| 2015/0236215 A1* | 8/2015 | Park | H01L 33/387 257/98 |

FOREIGN PATENT DOCUMENTS

| | | |
|---|---|---|
| JP | 2008-112957 | 5/2008 |
| JP | 2008282930 A * | 11/2008 |
| JP | 2009-088299 | 4/2009 |
| JP | 2009-164423 | 7/2009 |
| JP | 2009-188422 | 8/2009 |
| JP | 2011108859 A * | 6/2011 |
| JP | 2011138820 A * | 7/2011 |
| JP | 2011-199122 | 10/2011 |
| KR | 10-2007-0041847 | 4/2007 |
| KR | 10-2011-0095177 | 8/2011 |
| KR | 10-2012-0014750 | 2/2012 |
| KR | 10-2012-0045542 | 5/2012 |
| KR | 10-2012-0053784 | 5/2012 |
| WO | WO2014/014298 | 1/2014 |
| WO | WO2014/014300 | 1/2014 |

OTHER PUBLICATIONS

International Search Report for PCT International Application No. PCT/KR2013/006458 (published Jan. 23, 2014 as WO2014/014299) dated Nov. 26, 2013; 5pgs.

International Search Report for PCT International Application No. PCT/KR2013/006459 (published Jan. 23, 2014 as WO2014/014300) dated Nov. 26, 2013; 5pgs.

* cited by examiner

[Fig. 1]
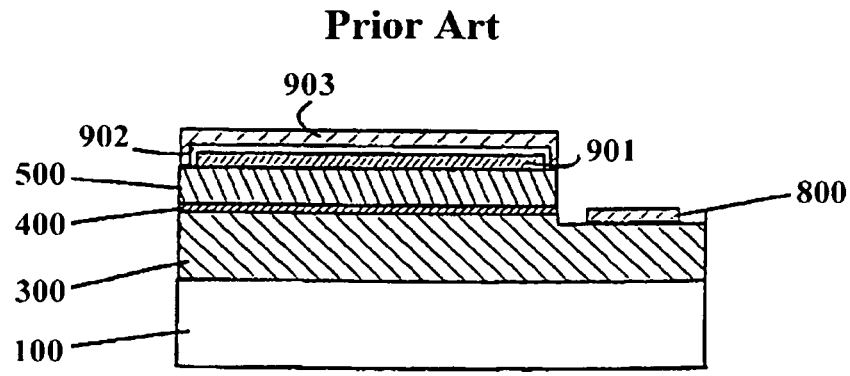
[Fig. 2]
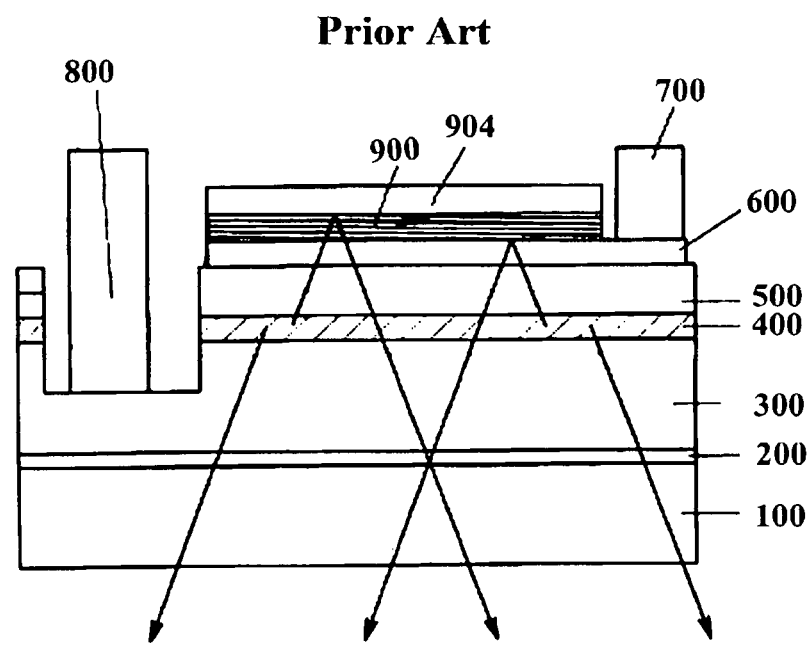
[Fig. 3]
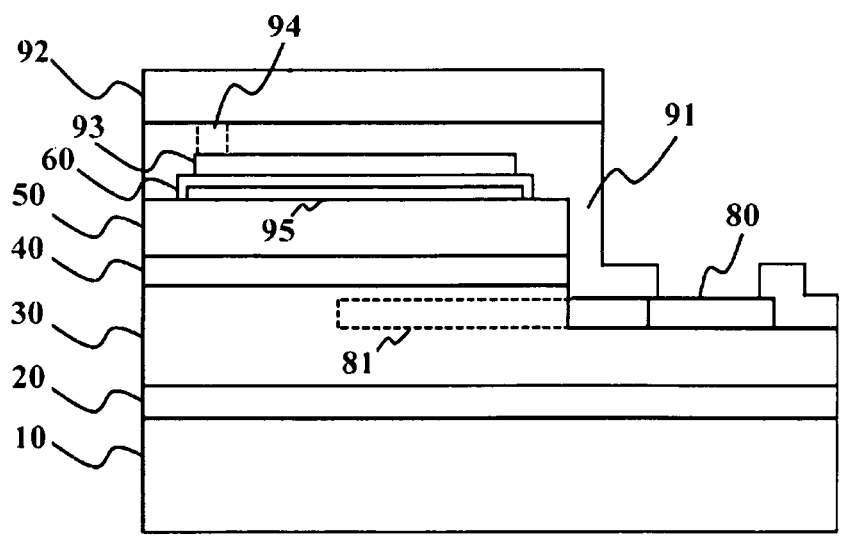

[Fig. 4]
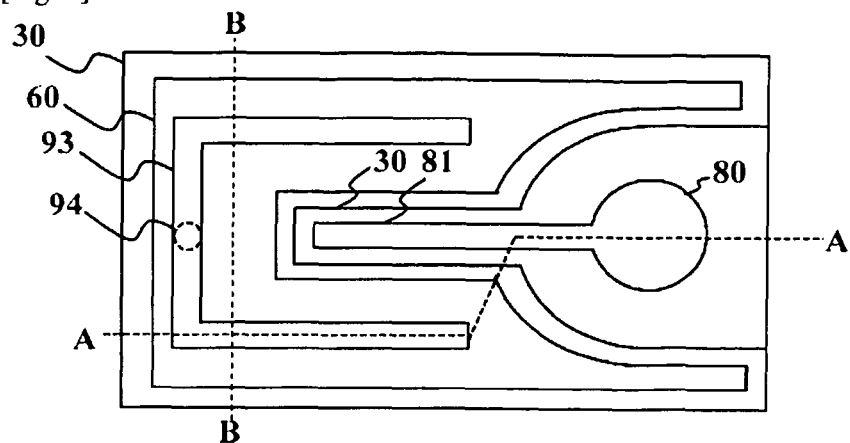
[Fig. 5]
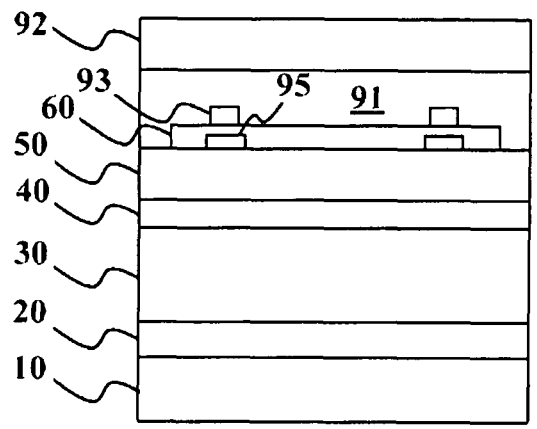
[Fig. 6]
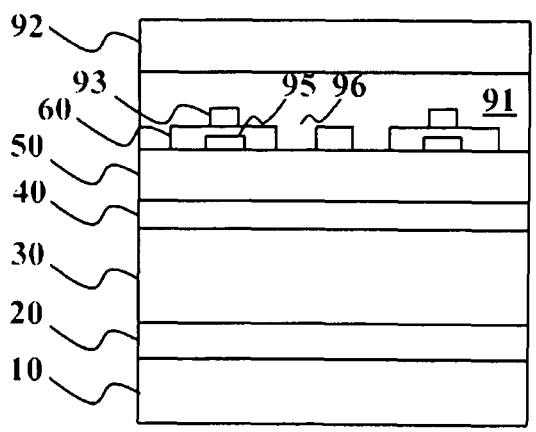

[Fig. 7]
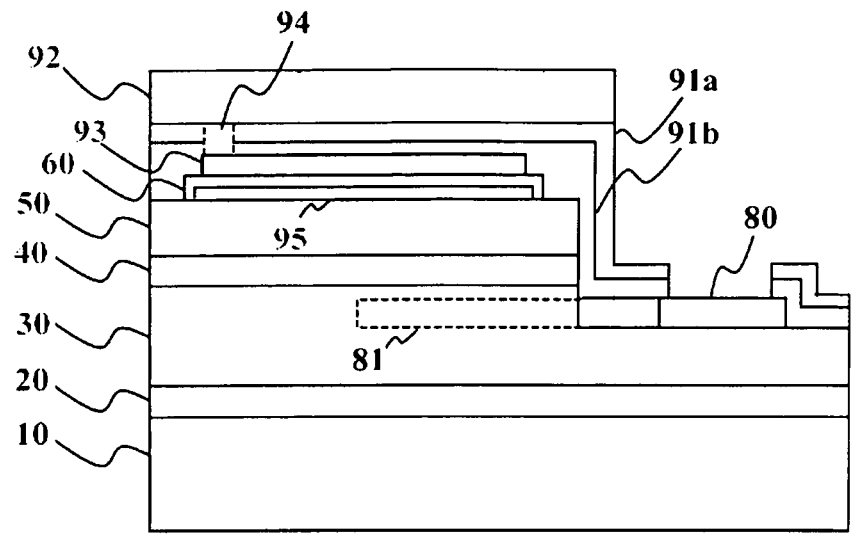
[Fig. 8]
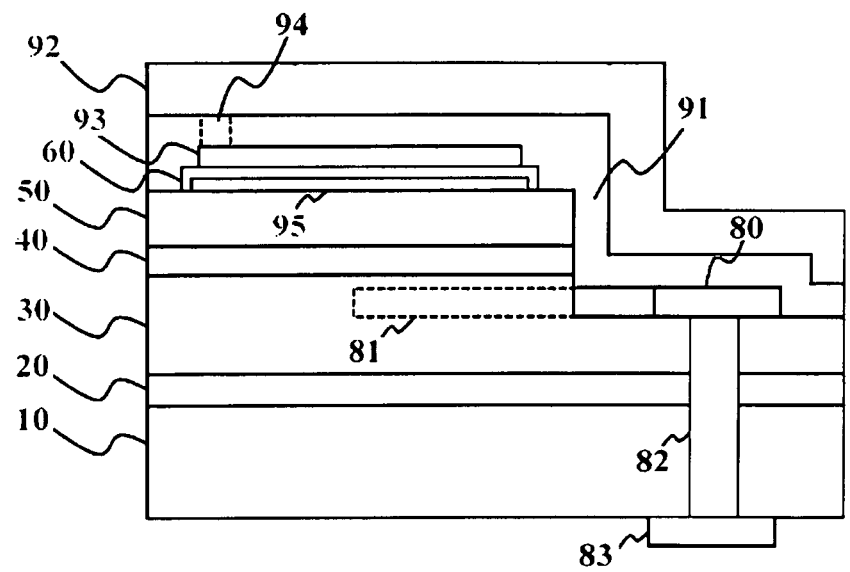

[Fig. 9]
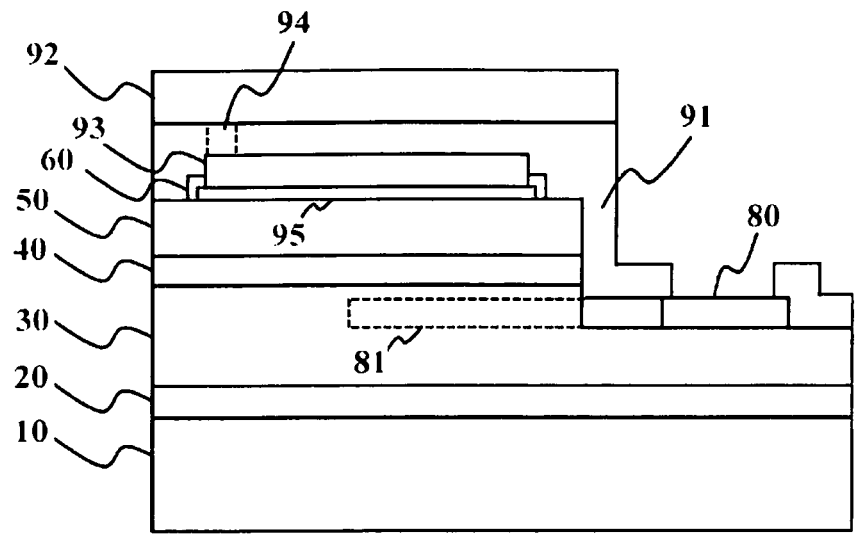
[Fig. 10]
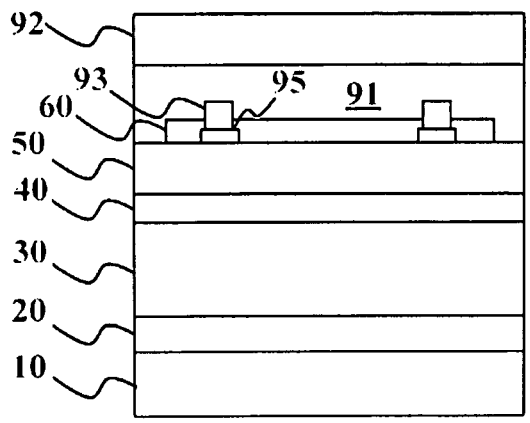
[Fig. 11]
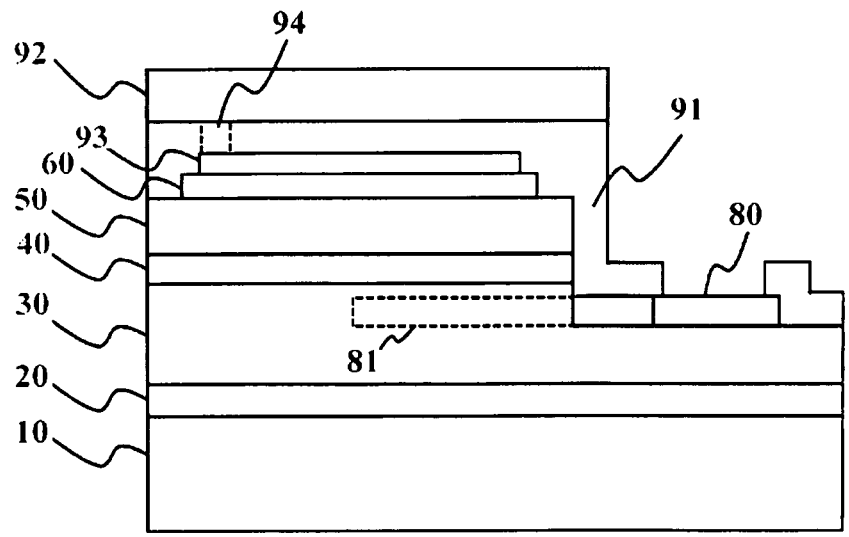

[Fig. 12]
Prior Art
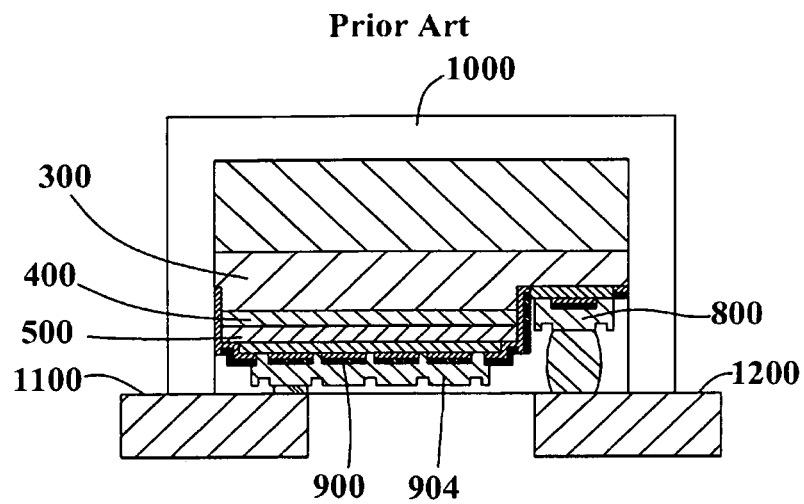
[Fig. 13]
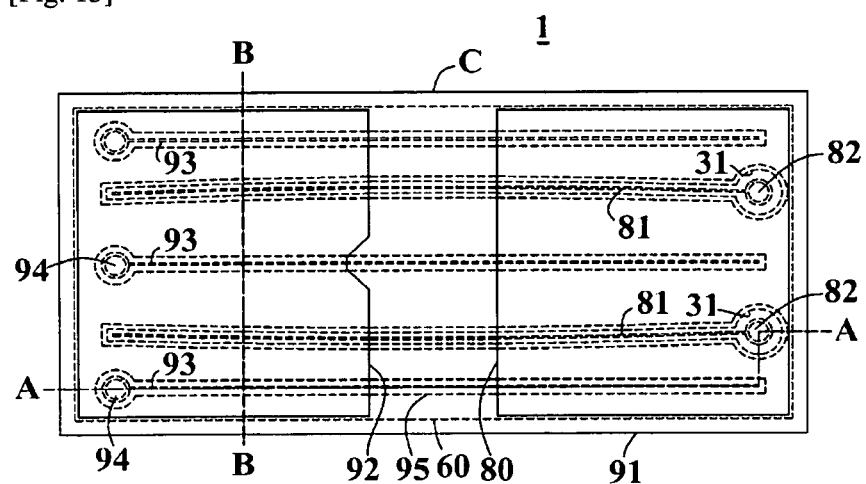
[Fig. 14]
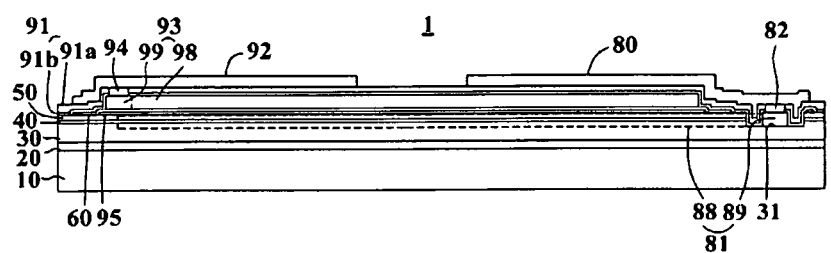

[Fig. 15]
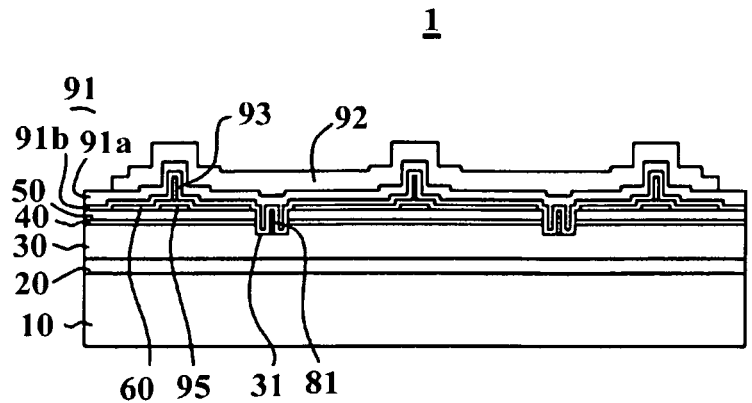
[Fig. 16]
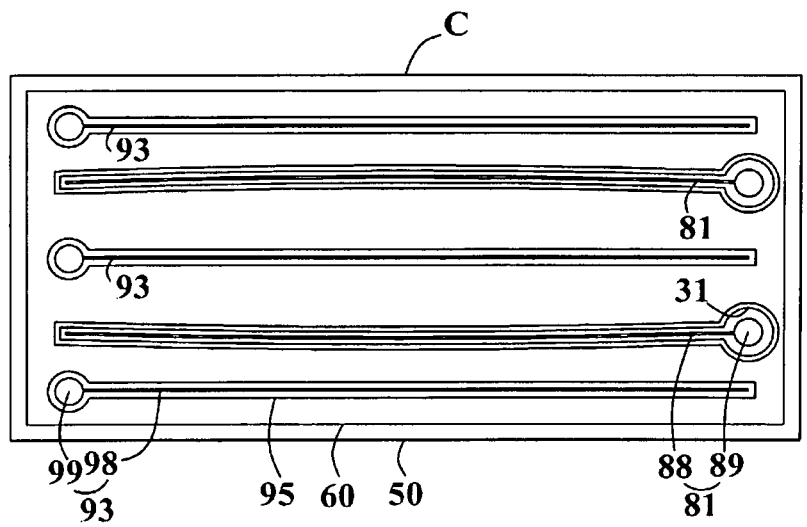
[Fig. 17]
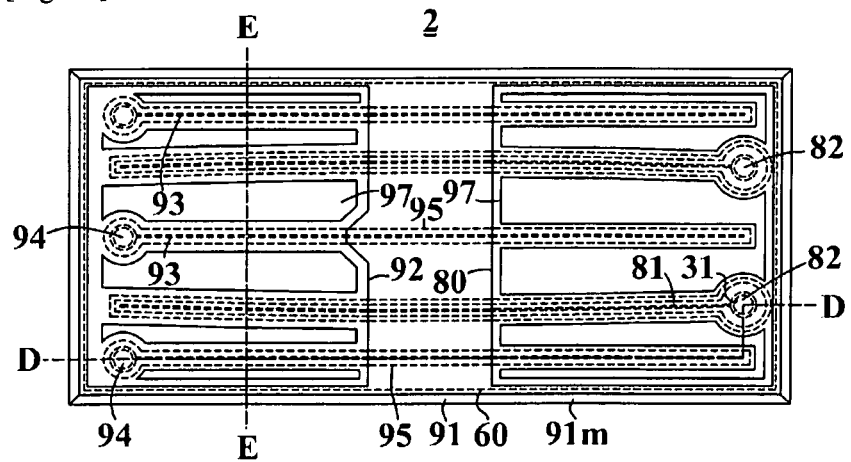

[Fig. 18]
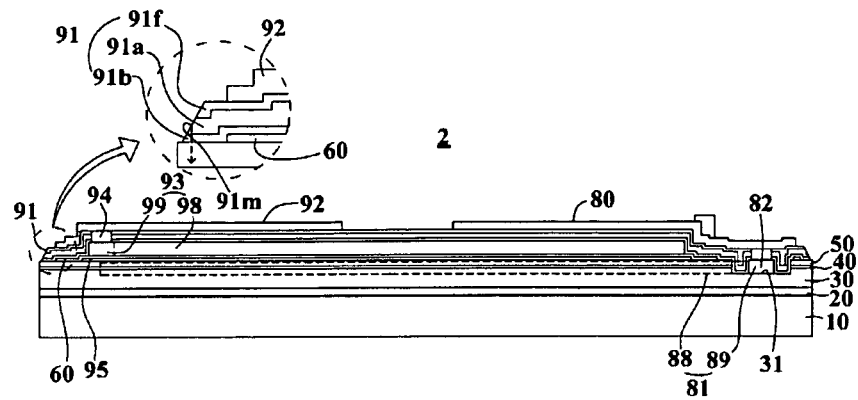
[Fig. 19]
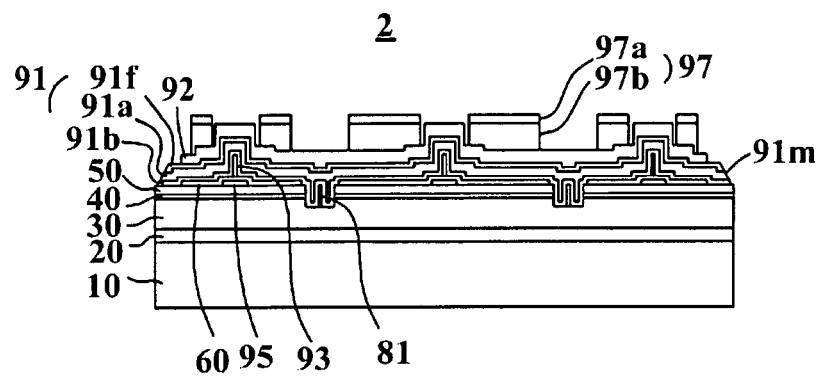
[Fig. 20]
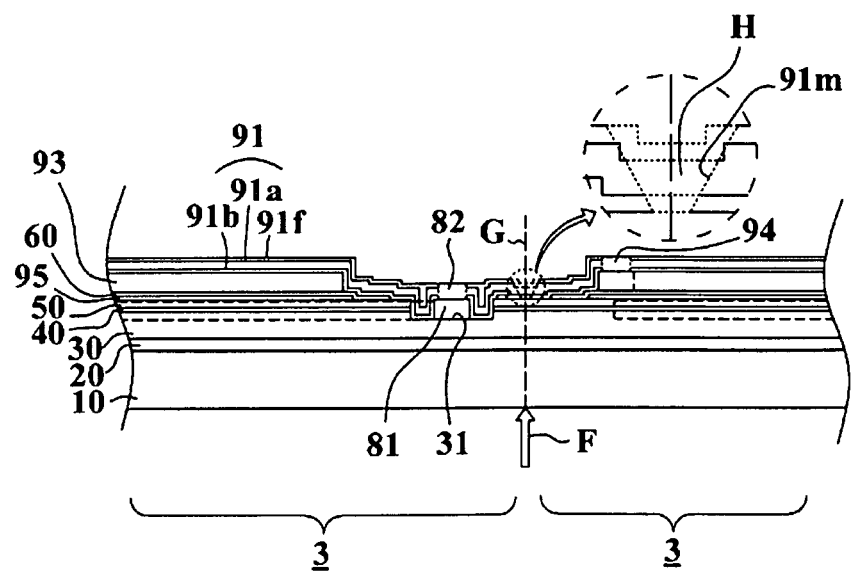

[Fig. 21]
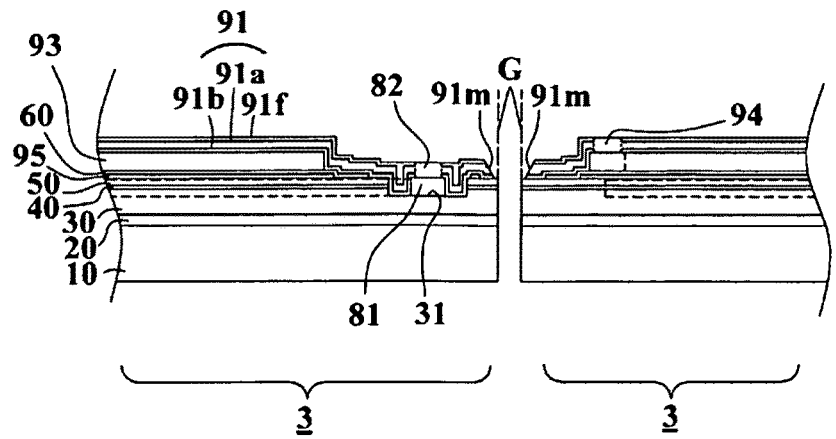
[Fig. 22]
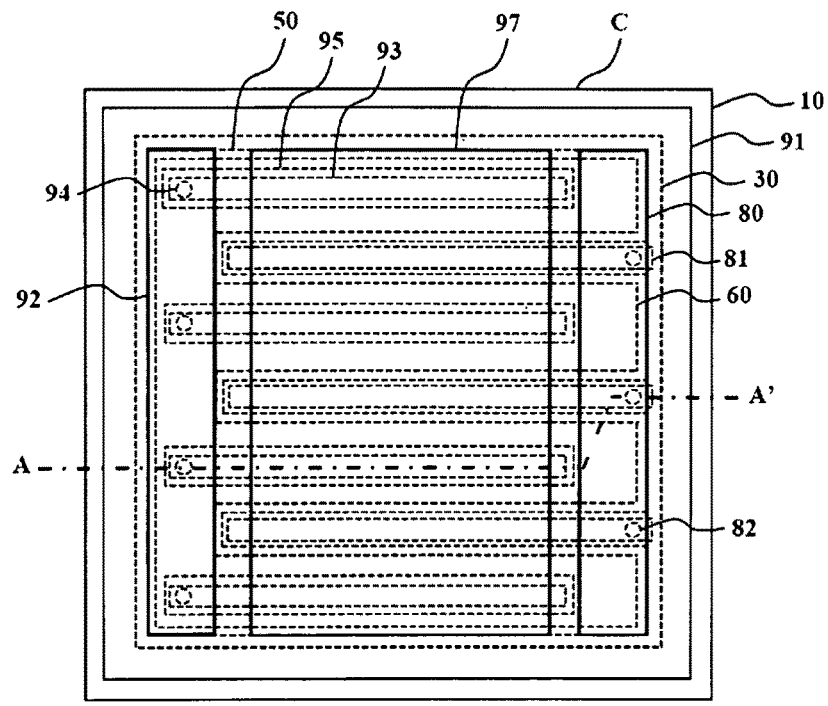
[Fig. 23]
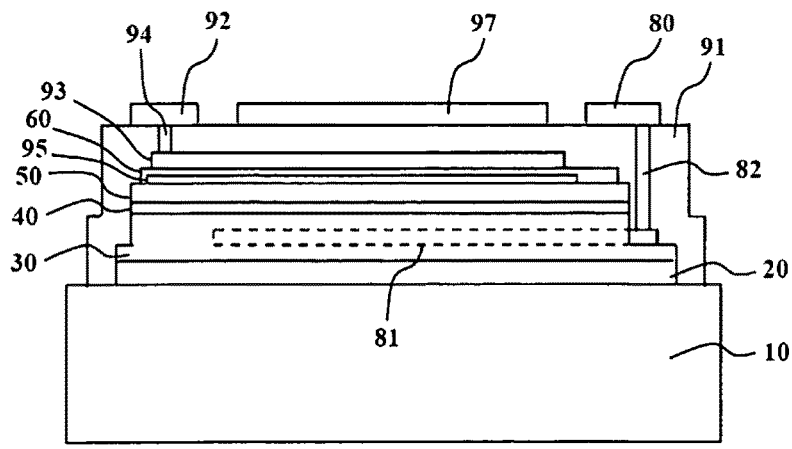

[Fig. 24]
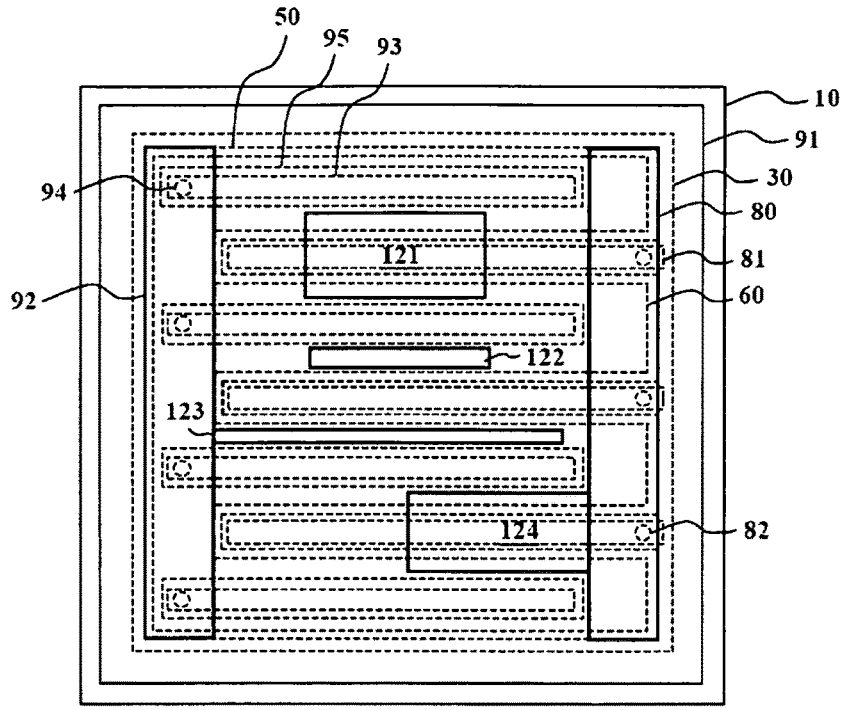
[Fig. 25]
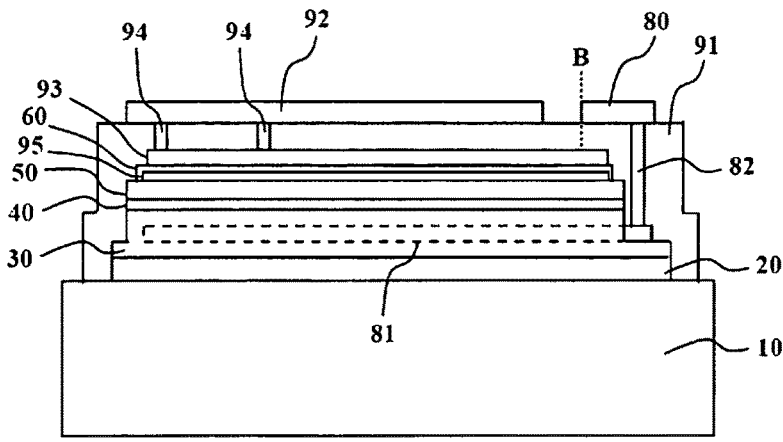
[Fig. 26]
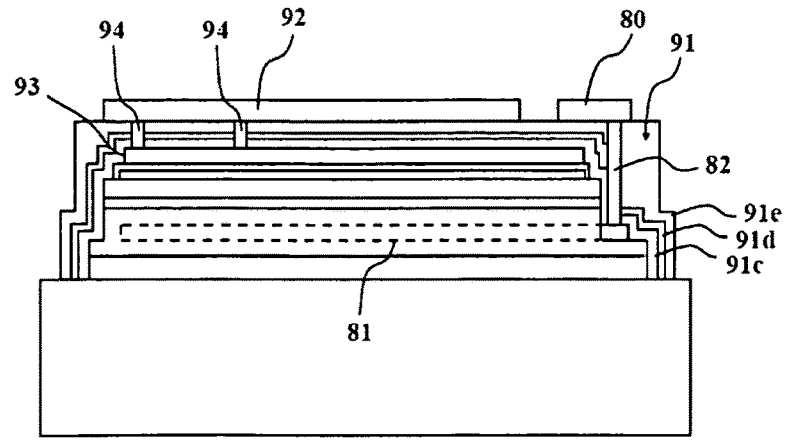

[Fig. 27]
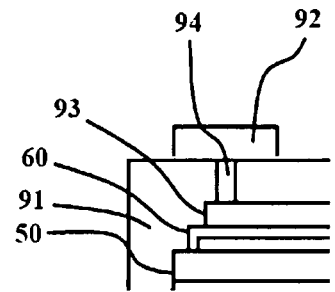
[Fig. 28]
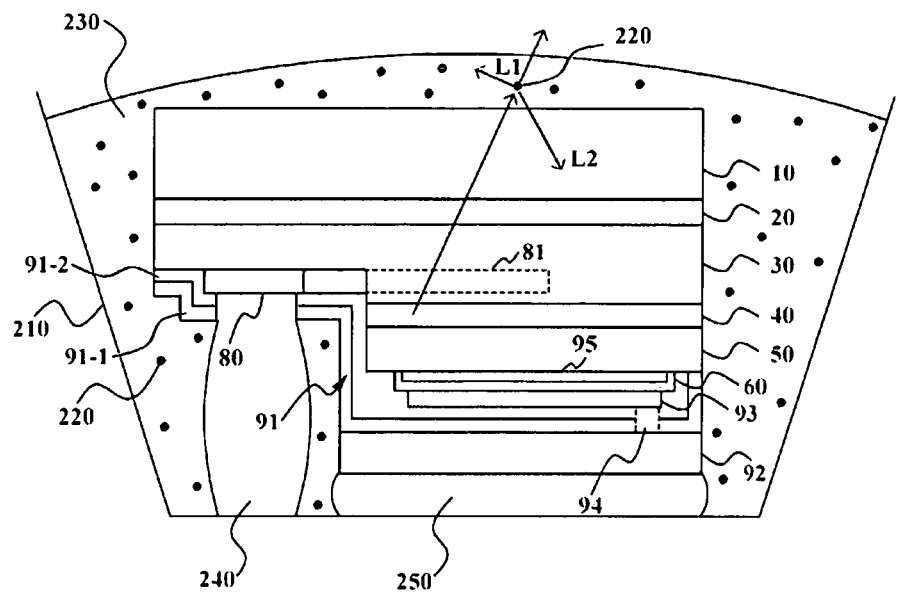
[Fig. 29]
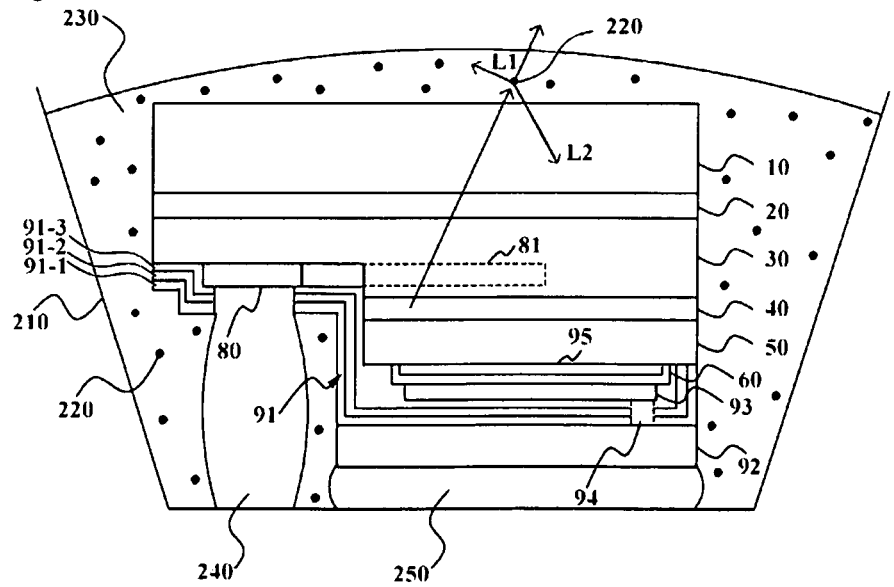

[Fig. 30]
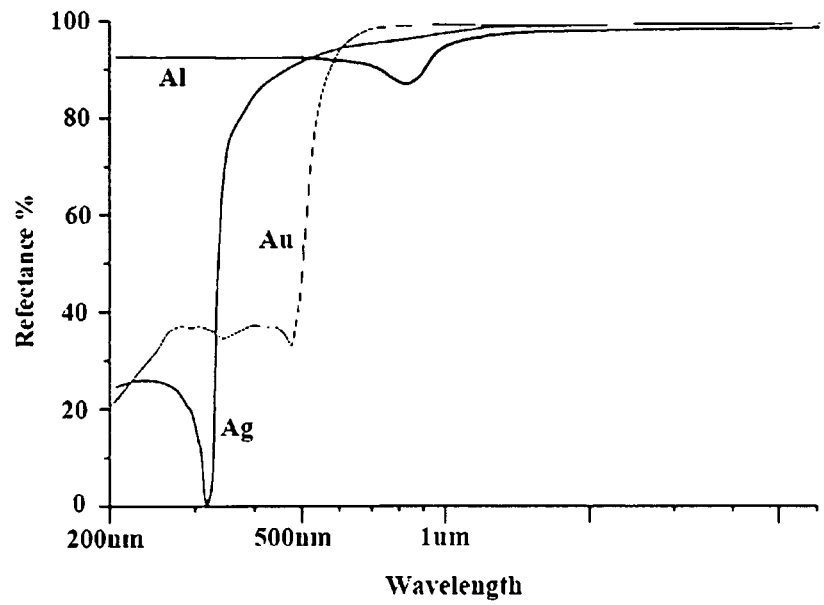
[Fig. 31]
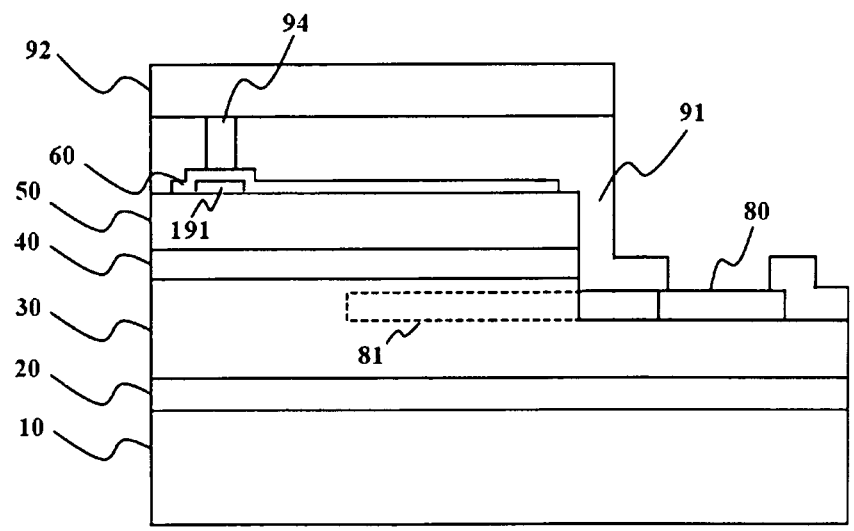

[Fig. 35]
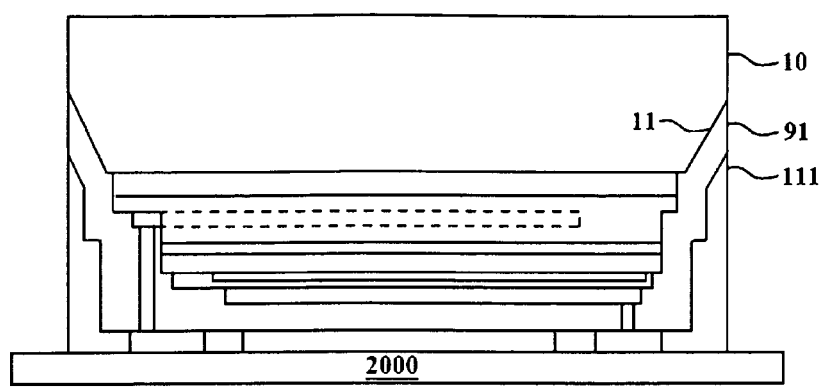

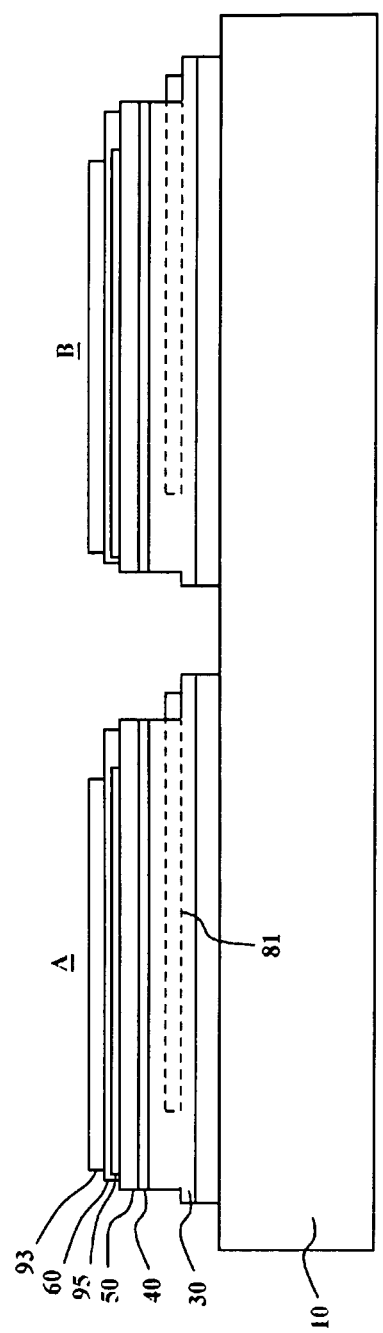
[Fig. 36]

[Fig. 37]
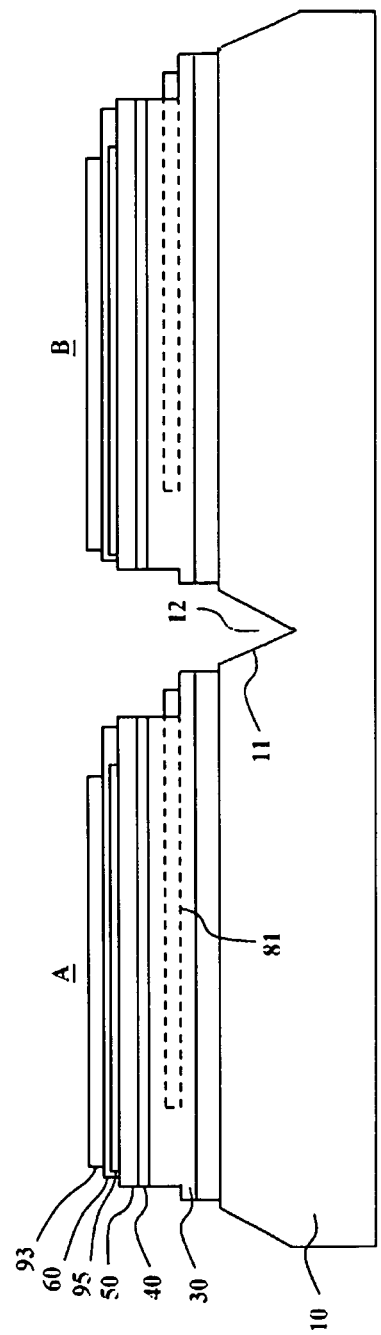

[Fig. 38]
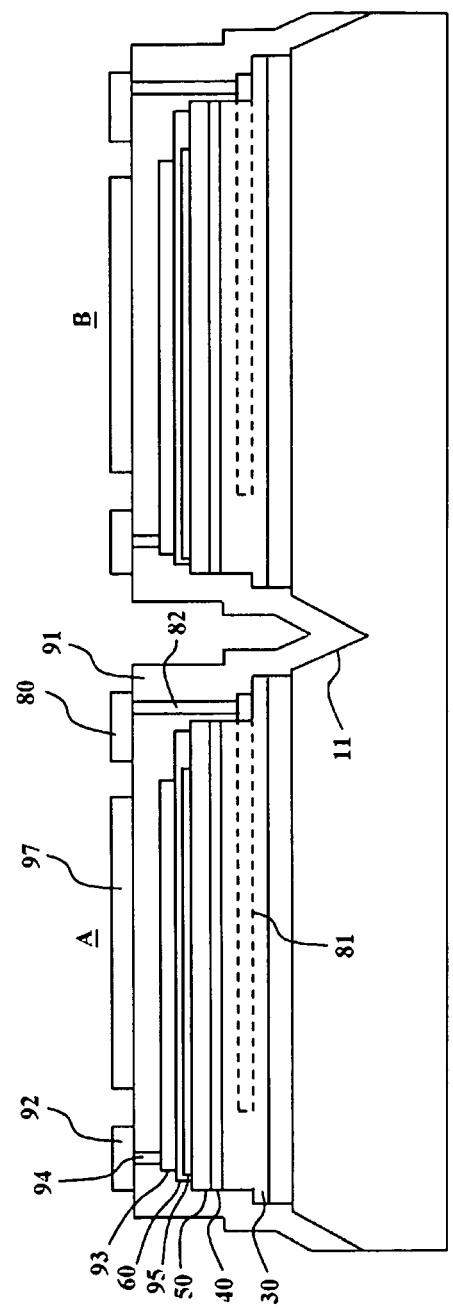

[Fig. 39]
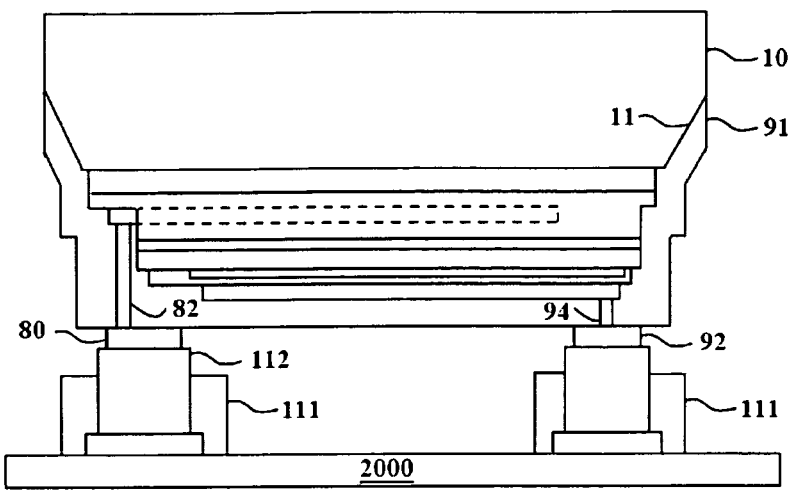
[Fig. 40]
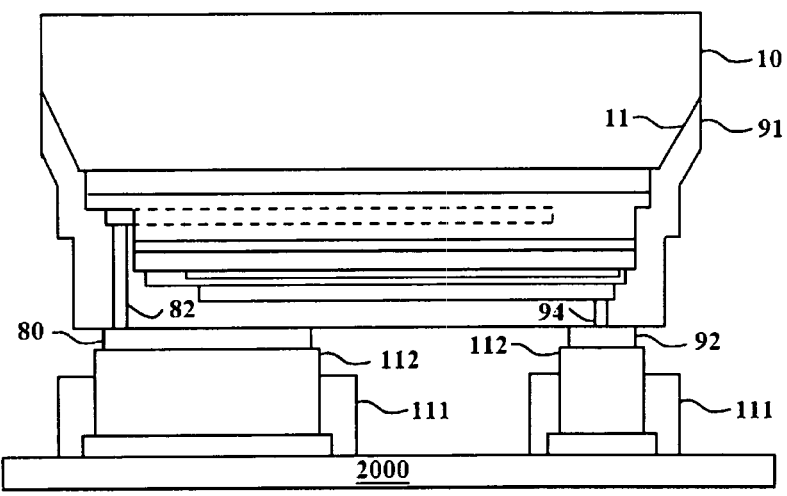
[Fig. 41]
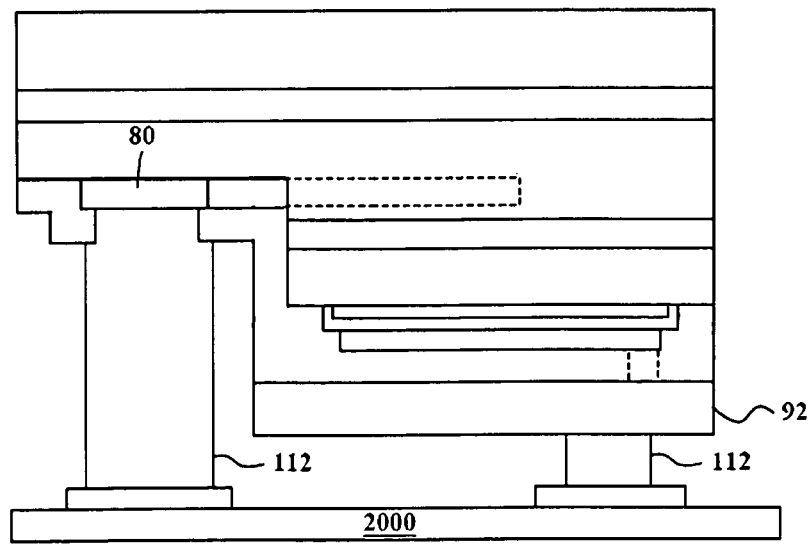

[Fig. 42]
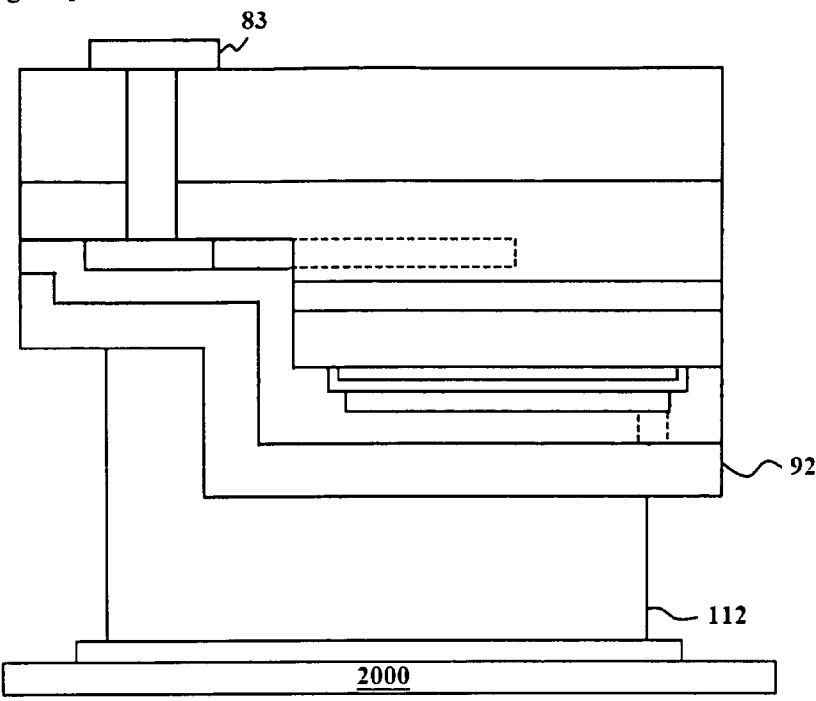
[Fig. 43]
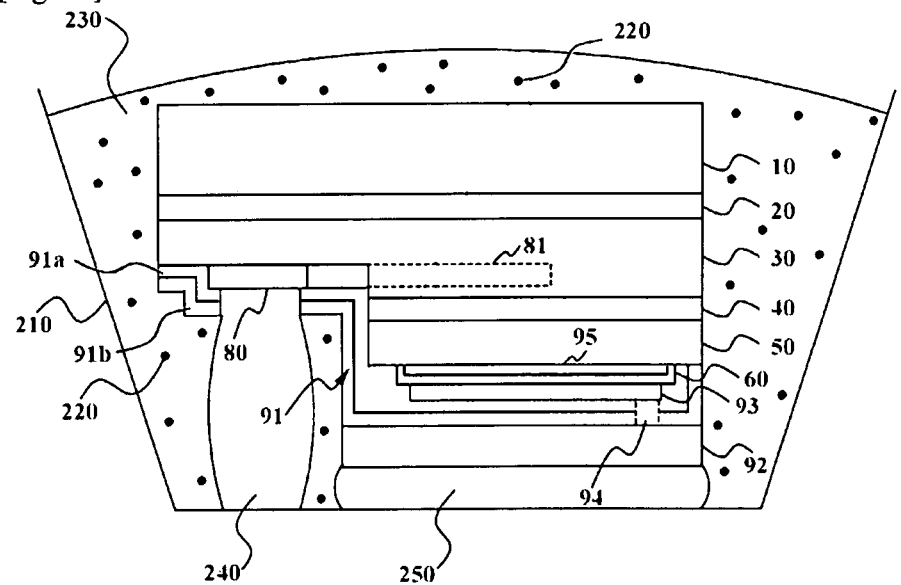
[Fig. 44]
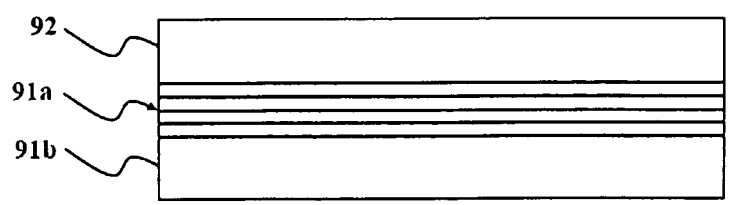

[Fig. 45]
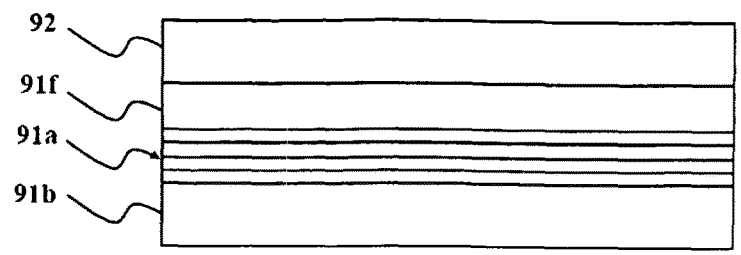
[Fig. 46]
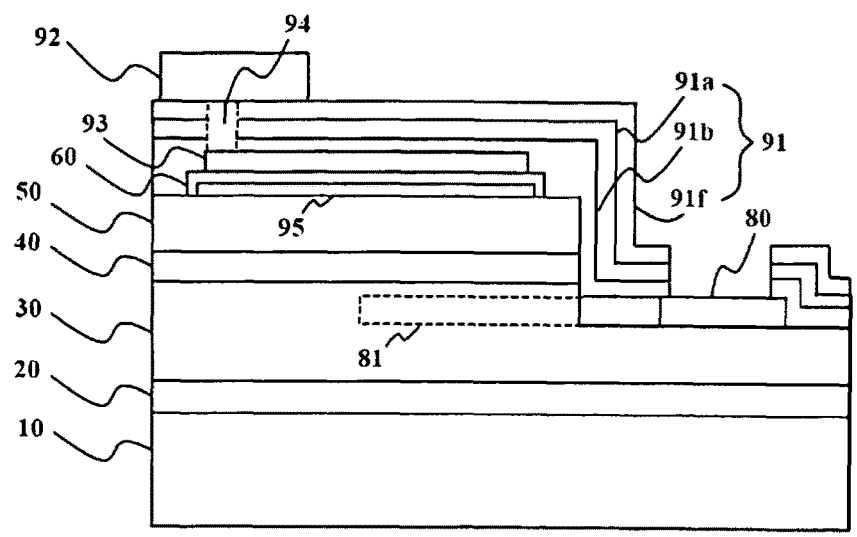
[Fig. 47]
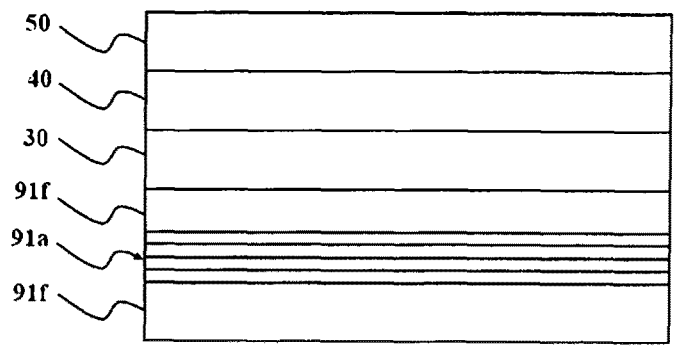
[Fig. 48]
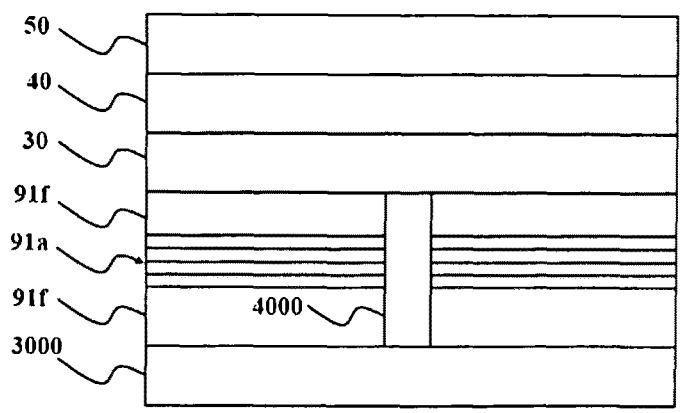

[Fig. 49]
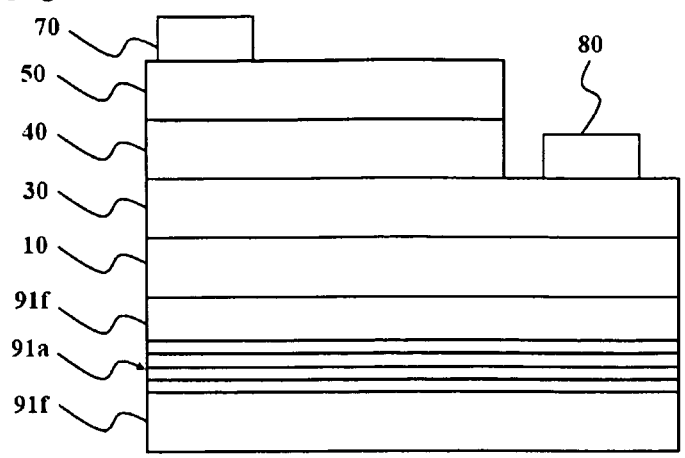
[Fig. 50]
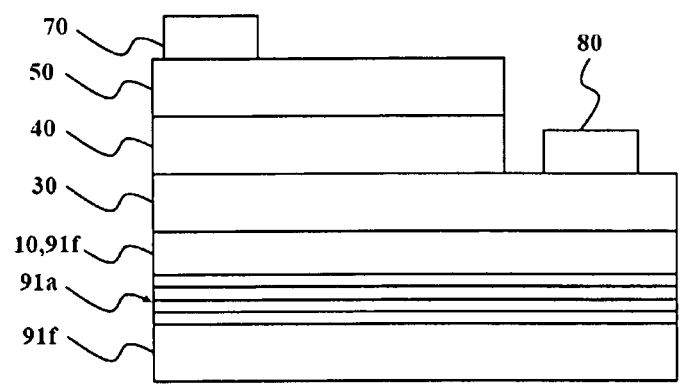

SEMICONDUCTOR LIGHT EMITTING DEVICE COMPRISING FINGER ELECTRODES

CROSS-REFERENCE TO RELATED APPLICATIONS

This application is a U.S. national stage filing under 35 U.S.C. § 371 of International Application No. PCT/KR2013/006458 filed Jul. 18, 2013, and claims priority to Korean Application No. 10-2012-0078270 filed Jul. 18, 2012, Korean Application No. 10-2012-0083091 filed Jul. 30, 2012 and Korean Application No. 10-2013-0002949 filed Jan. 10, 2013. The disclosures of the aforementioned applications are incorporated herein by reference in their entireties.

FIELD

The present disclosure relates generally to a semiconductor light emitting device, and more particularly to a semiconductor light emitting device having a light reflecting face.

Within the context herein, the term "semiconductor light emitting device" refers to a semiconductor optical device which generates light via electron-hole recombination, and one example is a group III-nitride semiconductor light emitting device. The group III-nitride semiconductor consists of a compound containing $Al_{(x)}Ga_{(y)}In_{(1-x-y)}N$ (wherein, $0.5 \leq x \leq 1$, $0 \leq y \leq 1$, $0 \leq x+y \leq 1$). Another example thereof is a GaAs-based semiconductor light emitting device used for red light emission.

BACKGROUND

This section provides background information related to the present disclosure which is not necessarily prior art.

FIG. 1 is a view illustrating an example of the semiconductor light emitting device proposed in U.S. Pat. No. 7,262,436. The semiconductor light emitting device includes a substrate 100, an n-type semiconductor layer 300 grown on the substrate 100, an active layer 400 grown on the n-type semiconductor layer 300, a p-type semiconductor layer 500 grown on the active layer 400, electrodes 901, 902 and 903 formed on the p-type semiconductor layer 500, while serving as reflective films, and an n-side bonding pad 800 formed on the n-type semiconductor layer 300 which has been etched and exposed. The n-type semiconductor layer 300 and the p-type semiconductor layer 500 can be of opposite conductive types. Preferably, a buffer layer (not shown) is provided between the substrate 100 and the n-type semiconductor layer 300. A chip having this structure, i.e. where all the electrodes 901, 902 and 903 and the n-side bonding pad 800 are formed on the opposite side of the substrate 100, with the electrodes 901, 902 and 903 serving as reflective films, is called a flip-chip. The electrodes 901, 902 and 903 are made up of an electrode 901 (e.g., Ag) with a high reflectance, an electrode 903 (e.g., Au) for bonding, and an electrode 902 (e.g., Ni) for preventing diffusion between materials of the electrode 901 and materials of the electrode 903. While this metal reflective film structure has a high reflectance and is advantageous for current spreading, it has a drawback that the metal absorbs light.

FIG. 2 is a view illustrating an example of the semiconductor light emitting device proposed in JP Pub. No. 2006-120913. The semiconductor light emitting device includes a substrate 100, a buffer layer grown on the substrate 100, an n-type semiconductor layer 300 grown on the buffer layer 200, an active layer 400 grown on the n-type semiconductor layer 300, a p-type semiconductor layer 500 grown on the active layer 400, a light-transmitting conductive film 600 with a current spreading function formed on the p-type semiconductor layer 500, a p-side bonding pad 700 formed on the light-transmitting conductive film 600, and an n-side bonding pad 800 formed on the n-type semiconductor layer 300 which has been etched and exposed. Further, a DBR (Distributed Bragg Reflector) 900 and a metal reflective film 904 are provided on the light-transmitting conductive film 600. While this structure reduces light absorption by the metal reflective film 904, it has a drawback that current spreading is relatively poor, compared with the use of the electrodes 901, 902 and 903.

FIG. 12 is a view illustrating an example of the semiconductor light emitting device proposed in JP Pub. No. 2009-164423. In the semiconductor light emitting device, a DBR 900 and a metal reflective film 904 are provided on a plurality of semiconductor layers 300, 400 and 500, a phosphor 1000 is provided on opposite side thereof. The metal reflective film 904 and an n-side bonding pad 800 are electrically connected with external electrodes 1100 and 1200. The external electrodes 1100 and 1200 can be lead frames for a package, or electrical patterns provided on the COB (Chip on Board) or PCB (Printed Circuit Board). The phosphor 1000 can be coated conformally, or can be mixed with an epoxy resin and then used to cover the external electrodes 1100 and 1200. The phosphor 1000 absorbs light that is generated in the active layer, and converts this light to a light of longer or shorter wavelength.

SUMMARY

The problems to be solved by the present disclosure will be described in the latter part of the best mode for carrying out the invention.

This section provides a general summary of the present disclosure and is not a comprehensive disclosure of its full scope or all of its features.

According to one aspect of the present disclosure, there is provided a semiconductor light emitting device comprising: a plurality of semiconductor layers including a first semiconductor layer having a first conductivity, a second semiconductor layer having a second conductivity different from the first conductivity, and an active layer interposed between the first semiconductor layer and the second semiconductor layer and generating light via electron-hole recombination; a non-conductive reflective film provided on the plurality of semiconductor layers for reflecting the light from the active layer towards the first semiconductor layer; first and second electrodes provided on the non-conductive reflective film and electrically connected with the plurality of semiconductor layers; and, at least one finger electrode extended between the non-conductive reflective film and the plurality of semiconductor layers, the at least one finger electrode being electrically connected to one of the first and second electrodes.

The advantageous effects of the present disclosure will be described in the latter part of the best mode for carrying out the invention.

BRIEF DESCRIPTION OF DRAWINGS

FIG. 1 is a view illustrating an example of the semiconductor light emitting device proposed in U.S. Pat. No. 7,262,436.

FIG. 2 is a view illustrating an example of the semiconductor light emitting device proposed in JP Pub. No. 2006-120913.

FIG. 3 to FIG. 5 are views illustrating an example of the semiconductor light emitting device according to the present disclosure.

FIG. 6 is a view illustrating another example of the semiconductor light emitting device according to the present disclosure.

FIG. 7 is a view illustrating still another example of the semiconductor light emitting device according to the present disclosure.

FIG. 8 is a view illustrating still another example of the semiconductor light emitting device according to the present disclosure.

FIG. 9 and FIG. 10 are views illustrating further examples of the semiconductor light emitting device according to the present disclosure.

FIG. 11 is a view illustrating yet another example of the semiconductor light emitting device according to the present disclosure.

FIG. 12 is a view illustrating an example of the semiconductor light emitting device proposed in JP Pub. No. 2009-164423.

FIG. 13 is a view illustrating yet another example of the semiconductor light emitting device according to the present disclosure.

FIG. 14 is a cross section view taken along line A-A of FIG. 13.

FIG. 15 is a cross section view taken along line B-B of FIG. 13.

FIG. 16 is a view illustrating the semiconductor light emitting device of FIG. 13, without the p-side and n-side electrodes and the non-conductive reflective film.

FIG. 17 is a view illustrating yet another example of the semiconductor light emitting device according to the present disclosure.

FIG. 18 is a cross section view taken along line D-D of FIG. 17.

FIG. 19 is a cross section view taken along line E-E of FIG. 17.

FIG. 20 is a view illustrating a state of two semiconductor light emitting devices before they are divided into individual semiconductor light emitting devices, during the manufacturing process of a semiconductor light emitting device.

FIG. 21 is a view illustrating a state of two semiconductor light emitting devices after they are divided into individual semiconductor light emitting devices, during the manufacturing process of a semiconductor light emitting device.

FIG. 22 is a view illustrating still another example of the semiconductor light emitting device according to the present disclosure.

FIG. 23 is a cross section view taken along line A-A' of FIG. 22.

FIG. 24 is a view illustrating still another example of the semiconductor light emitting device according to the present disclosure.

FIG. 25 is a view illustrating still another example of the semiconductor light emitting device according to the present disclosure.

FIG. 26 is a view illustrating still another example of the semiconductor light emitting device according to the present disclosure.

FIG. 27 is an enlarged view of the area where an electrical connection is formed.

FIG. 28 is a view illustrating still another example of the semiconductor light emitting device according to the present disclosure.

FIG. 29 is a view illustrating still another example of the semiconductor light emitting device according to the present disclosure.

FIG. 30 graphically shows reflectivity as a function of wavelengths of aluminum (Al), silver (Ag) and gold (Au).

FIG. 31 is a view illustrating still another example of the semiconductor light emitting device according to the present disclosure.

FIG. 34 and FIG. 35 are views illustrating still other examples of the semiconductor light emitting device according to the present disclosure.

FIG. 36 to FIG. 38 are views illustrating an exemplary process for manufacturing the semiconductor light emitting device shown in FIG. 34.

FIG. 39 is a view illustrating still another example of the semiconductor light emitting device according to the present disclosure.

FIG. 40 is a view illustrating still another example of the semiconductor light emitting device according to the present disclosure.

FIG. 41 is a view illustrating still another example of the semiconductor light emitting device according to the present disclosure.

FIG. 42 is a view illustrating still another example of the semiconductor light emitting device according to the present disclosure.

FIG. 43 is a view illustrating still another example of the semiconductor light emitting device according to the present disclosure.

FIG. 44 is a view illustrating a relation among a dielectric film, a distributed bragg reflector and an electrode in the semiconductor light emitting device shown in FIG. 7.

FIG. 45 is a view illustrating a relation among a dielectric film having an optical waveguide incorporated therein, a distributed bragg reflector and an electrode in the semiconductor light emitting device shown in FIG. 7.

FIG. 46 is a view illustrating one example of the semiconductor light emitting device into which the optical waveguide described in FIG. 45 is incorporated.

FIG. 47 illustrates a conceptual view of the semiconductor light emitting device to which an optical waveguide according to the present disclosure is applied.

FIG. 48 is a view illustrating another example of the semiconductor light emitting device to which an optical waveguide according to the present disclosure is applied.

FIG. 49 is a view illustrating yet another example of the semiconductor light emitting device to which an optical waveguide according to the present disclosure is applied.

FIG. 50 is a view illustrating still another example of the semiconductor light emitting device to which an optical waveguide according to the present disclosure is applied.

DETAILED DESCRIPTION

Figure 32:
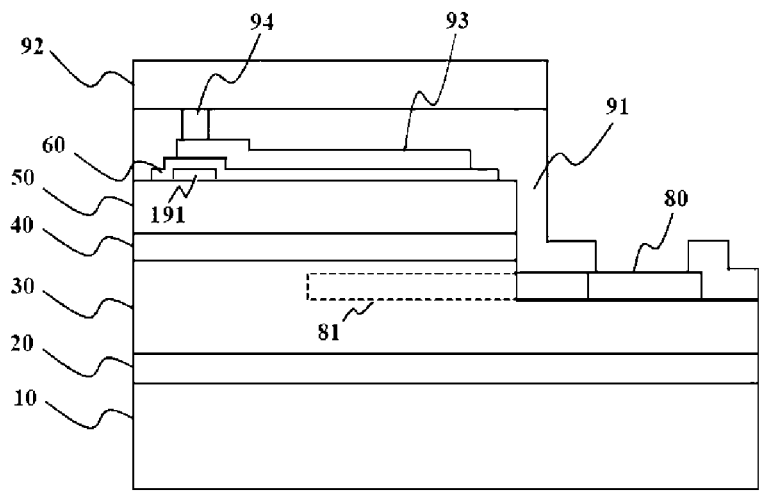
FIG. 32 is a view illustrating still another example of the semiconductor light emitting device according to the present disclosure.

The present disclosure will now be described in detail with reference to the accompanying drawings.

FIG. 3 to FIG. 5 are views illustrating an example of the semiconductor light emitting device according to the present disclosure, in which FIG. 3 is a cross section view taken along line A-A of FIG. 4, and FIG. 5 is a cross section view taken along line B-B of FIG. 4. For the sake of convenient explanation, a non-conductive reflective film 91 and an electrode 92 are not shown in FIG. 4.

The semiconductor light emitting device includes a substrate 10, a buffer layer 20 grown on the substrate 10, an n-type semiconductor layer 30 grown on the buffer layer 20, an active layer grown on the n-type semiconductor layer 30, generating light via electron-hole recombination, and a p-type semiconductor layer 50 grown on the active layer 40. The substrate 10, which can eventually be removed, is mainly made of sapphire, SiC, Si, GaN or the like, and the buffer layer 20 can be omitted. When the substrate 10 is removed or has conductivity, an electrode 80 may be formed on the n-type semiconductor layer 30 side after the substrate 10 is removed therefrom, or on the conductive substrate 10 side. The positions of the n-type semiconductor layer 30 and the p-type semiconductor layer 50 can be changed with each other. For a group III nitride semiconductor light emitting device, those semiconductor layers are mainly made of GaN. Each of the semiconductor layers 20, 30, 40 and 50 can be configured in a plurality of sub layers, and the semiconductor light emitting device may also have an additional semiconductor layer. In addition to the electrode 80 that provides electrons to the n-type semiconductor layer 30, the semiconductor light emitting device includes an electrode 92 that provides holes to the p-type semiconductor layer 50. A finger electrode 81 extended into the n-type semiconductor layer 30 forms a part of the electrode 80. The electrode 80 may have an additional bump that makes the electrode 80 sufficiently high enough to be coupled with a package, or the electrode 80 per se may be deposited up to a height where it can be coupled with a package as shown in FIG. 2. In order to reflect light from the active layer 40 towards the substrate 10 used for the growth or towards the n-type semiconductor layer 30 if the substrate 10 has been removed, a non-conductive reflective film 91 is provided over the p-type semiconductor layer 50. Also, the non-conductive reflective film 91 may be formed on the n-type semiconductor layer 30 exposed by etching, and on a portion of the electrode 80. A person skilled in the art should understand that it is not absolutely necessary for the non-conductive reflective film 91 to cover the entire area over the semiconductor layers 30 and 50 on the opposite side of the substrate 10. The non-conductive reflective film 91 serves as a reflective film, yet it can preferably be composed of a light-transmitting material, for example, a light-transmitting dielectric material such as $SiO_x$, $TiO_x$, $Ta_2O_5$ or $MgF_2$, in order to avoid the light absorption. When the non-conductive reflective film 91 is composed of $SiO_x$, its refractive index is lower than that of the p-type semiconductor layer 50 (e.g., GaN) such that it can reflect part of the light having an incidence angle greater than a critical angle towards the semiconductor layers 30, 40 and 50. When the non-conductive reflective film 91 is composed of a DBR (e.g., DBR composed of the combination of $SiO_2$ and $TiO_2$), it can reflect a greater amount of light towards the semiconductor layers 30, 40 and 50. In FIG. 7, the non-conductive reflective film 91 has a double layer structure having a DBR 91a and a dielectric film 91b with a refractive index lower than that of the p-type semiconductor layer 50. As the deposition of the DBR 91a needs to be done with high precision, the dielectric film 91b having a uniform thickness is first formed before the deposition. As such, despite heterogeneous deposits 50, 60, 80, 81 and 93 of different forms which are present on the semiconductor layers 30, 40 and 50, the DBR 91b can be prepared in a stable manner, and light reflection can also benefit therefrom. The dielectric film 91b is suitably made of $SiO_2$ and it has a thickness suitably ranging from 0.2 µm to 1.0 µm. When the DBR 91a is composed of $TiO_2/SiO_2$, each layer is designed to have an optical thickness of one-fourth of a given wavelength, and the number of its combinations is suitably between 4 and 20 pairs. Further, the finger electrode 93 has a height suitably ranging from 0.5 µm to 4.0 µm. If the finger electrode is thinner than the range, it can lead to an increased operating voltage; and if the finger electrode is thicker than the range, it can affect the stability of the process and increase the material cost. Considering that the electrode 92 contributes to reflecting light from the active layer 30 towards the substrate 10 or towards the n-type semiconductor layer 30, it is preferably a conductive reflective film that covers all or almost all of the non-conductive reflective film 91 over the p-type semiconductor layer 50. To this end, metals having a high reflectance, such as Al or Ag, may be utilized. A finger electrode 93 is extended between the non-conductive reflective film 91 and the p-type semiconductor layer 50, for supplying current (holes, to be precise) from the electrode 92 to the p-type semiconductor layer 50. The introduction of the finger electrode 93 provides a foundation for realizing a flip-chip that has overcome all the problems imposed by the flip-chips in FIG. 1 and FIG. 2. For electrical communication between the electrode 92 and the finger electrode 93 which are separated by the non-conductive reflective film 91 interposed between them, an electrical connection 94 is prepared in the vertical direction, passing through the non-conductive reflective film 91. Without the finger electrode 93, a number of electrical connections 94 will have to be connected directly to a light-transmitting conductive film 60 that is prepared on almost the entire face of the p-type semiconductor layer 50. In this case, however, it is not easy to form an acceptable electrical contact between the electrode 92 and the light-transmitting conductive film 60, and many problems might be created during the manufacturing process. In this regard, the present disclosure forms the finger electrode 93, prior to the formation of the non-conductive reflective film 91 and the electrode 92, on the p-type semiconductor layer 50 or preferably on the light-transmitting conductive film 60 and then performs thermal treatment on the finger electrode 93, such that a stable electrical contact can be created between both. While Al or Ag having a high reflectance is a suitable material for the electrode 92, materials such as Cr, Ti, Ni or alloys thereof also may be suitable for the stable electrical contact. Accordingly, by introducing the finger electrode 93, it makes it easy to meet the required design specifications. A person skilled in the art should understand that Al or Ag having a high reflectance can also be used for the finger electrode 93. As described above, the light-transmitting conductive film 60 is preferably provided. Especially, a p-type GaN has a poor current spreading capability, and when the p-type semiconductor layer 50 is composed of GaN, the light-transmitting conductive film 60 needs to be incorporated in most cases. For instance, materials such as ITO, Ni/Au or the like can be used for the light-transmitting conductive film 60. When the height of the finger electrode 93 reaches the electrode 92, the finger electrode 93 per se forms the electrical connection 94. Although it is possible to envisage configuring the electrode 92 with the same manner as a p-side bonding pad 700 as shown in FIG. 2, it would not be desirable as the p-side bonding pad 700 absorbs light, and the area of the non-conductive reflective film 91 is reduced. A person skilled in the art should understand that the electrode 92 can also be formed by a mounting face at the package level, following the manufacturing of a chip. It should be noted that all of the components mentioned hitherto will suffice to form the semiconductor light emitting device according to the present disclosure. However, since part of the light generated in the active layer 40 can be absorbed by the finger electrode 93, to avoid this, it is preferable to provide an optical absorption barrier 95 below the finger electrode 93. The optical absorption barrier 95 may only serve to reflect part or all of the light generated in the active layer 40, or may only serve to prevent the current from the finger electrode 93 from flowing to immediately below zone of the finger electrode 93, or may serve both functions. To perform these functions, the optical absorption barrier 95 can have a single layer (e.g., $SiO_2$) or a multilayer (e.g., $SiO_2/TiO_2/SiO_2$) that is made of a light-transmitting material(s) having a refractive index lower than that of the p-type semiconductor layer 50, or a DBR or any combination of the single layer and the DBR. In addition, the optical absorption barrier 95 can be composed of a non-conductive material (e.g., a dielectric film such as $SiO_x$, $TiO_x$ or the like). Therefore, although it is not always required to form the optical absorption barrier 95 with a light-transmitting material or with a non-conductive material, the effects thereof can be increased by incorporating a light-transmitting dielectric film.

FIG. 6 is a view illustrating another example of the semiconductor light emitting device according to the present disclosure, in which a light-transmitting conductive film 60 has openings 96 to enable a non-conductive reflective film 91 to contact with a p-type semiconductor layer 50. The openings 96 can have any shape, including a plurality of islands, bands and the like. Even if the light-transmitting conductive film 60 is composed of most common ITO, it absorbs part of the light generated in the active layer 40. However, the formation of the openings 96 makes it possible to reduce the light absorption by the light-transmitting conductive film 60. While current spreading into the entire p-type semiconductor layer 50 might not be sufficient, it can be complemented by the finger electrode 93. No description will be provided for like reference numerals that have been explained above.

FIG. 8 is a view illustrating still another example of the semiconductor light emitting device according to the present disclosure, which includes an electrical connection 82 passing through the substrate 10, the buffer layer 20 and the n-type semiconductor layer 30, and an electrode 83 on the substrate 10 or the n-type semiconductor layer 30 after the substrate 10 is removed therefrom, i.e. on the n-type semiconductor layer 30 side. This configuration enables to form a non-conductive reflective film 91 and an electrode 92 over the whole of plural semiconductor layers 30 and 50 on the opposite side of the substrate 10.

FIG. 9 and FIG. 10 are views illustrating further examples of the semiconductor light emitting device according to the present disclosure. In these examples, as the light-transmitting conductive film 60 is eliminated, the finger electrode 93 comes in direct contact with the optical absorption barrier 95.

FIG. 11 is a view illustrating still another example of the semiconductor light emitting device according to the present disclosure. Unlike the example of FIG. 5, the semiconductor light emitting device does not include the optical absorption barrier 95.

FIG. 13 is a view illustrating yet another example of the semiconductor light emitting device according to the present disclosure, FIG. 14 is a cross section view taken along line A-A of FIG. 13, and FIG. 15 is a cross section view taken along line B-B of FIG. 13. FIG. 16 is a view illustrating the semiconductor light emitting device of FIG. 13, without the p-side and n-side electrodes and the non-conductive reflective film.

The semiconductor light emitting device 1 includes a substrate 10, a buffer layer 20 grown on the substrate 10, an n-type semiconductor layer 30 grown on the buffer layer 20, an active layer 40 grown on the n-type semiconductor layer 30, generating light via electron-hole recombination, and a p-type semiconductor layer 50 grown on the active layer 40.

The substrate 10, which can eventually be removed, is mainly made of sapphire, SiC, Si, GaN or the like, and the buffer layer 20 can be omitted. When the substrate 10 is removed or has conductivity, an n-side electrode 80 may be formed on the n-type semiconductor layer 30 side after the substrate 10 is removed therefrom, or on the conductive substrate 10 side. The positions of the n-type semiconductor layer 30 and the p-type semiconductor layer 50 can be changed with each other. For a group III nitride semiconductor light emitting device, those semiconductor layers are mainly made of GaN. Each of the semiconductor layers 20, 30, 40 and 50 can be configured in a plurality of sub layers. The semiconductor light emitting device may also have an additional semiconductor layer.

Portions of the p-type semiconductor layer 50 and the active layer 40 are removed by a mesa etching process to form two n-side contact areas 31 where the n-type semiconductor layer 30 is exposed. An n-side finger electrode 81 is then formed on the n-type semiconductor layer 30 within each n-side contact area 31. The n-side contact areas 31 are extended in parallel with one side C of the semiconductor light emitting device. While the n-side contact areas 31 may be open to one of the lateral directions of the semiconductor light emitting device, they are preferably enclosed and blocked by the active layer 40 and the p-type semiconductor layer 50 without being open to any one of the lateral directions. The number of the n-side contact areas 31 may be increased or decreased, and the array configuration thereof can be varied. The n-side finger electrode 81 preferably includes a branch portion 88 extended lengthily, and a connecting portion 89 formed at one end of the branch portion 88 and having a greater width. As such, the n-side contact area 31 has a smaller width at the part where the branch portion 88 of the n-side finger electrode 81 is disposed and a greater width at the part where the connecting portion 89 of the n-side finger electrode 81 is disposed.

Three p-side finger electrodes 93 are formed on the p-type semiconductor layer 50. The p-side finger electrodes 93 are formed in parallel with the n-side finger electrodes 81, in which one of the p-side finger electrodes is arranged between two n-side finger electrodes 81 and the other two p-side finger electrodes are arranged on both sides of the n-side finger electrodes, respectively. Thus, the n-side finger electrodes 81 are placed among the p-side finger electrodes 93, respectively, in an alternate manner. Also, the p-side finger electrode 93 preferably includes a branch portion 98 extended lengthily, and a connecting portion 99 formed at one end of the branch portion 98 and having a greater width. Meanwhile, as shown in FIG. 13, the connecting portion 99 of the p-side finger electrode 93 is placed on the opposite side of the connecting portion 89 of the n-side finger electrode 81, when the semiconductor light emitting device is seen from the top. That is to say, the connecting portion 99 of the p-side finger electrode 93 is placed on the left side, while the connecting portion 89 of the n-side finger electrode 81 is placed on the right side. The p-side finger electrode 93 extends along the direction of one side C of the semiconductor light emitting device. For instance, in FIG. 13 and FIG. 16, it is extended from the left side to the right side. With these plural p-side finger electrodes 93 extended lengthily, the device can be placed on a mount part (e.g., a sub-mount, a package, or a COB (Chip on Board)) in an upside-down position without inclination. In this regard, it is preferable to form the p-side finger electrode 93 as long as possible.

A suitable height for the p-side finger electrodes 93 and the n-side finger electrodes 81 ranges from 2 μm to 3 μm. If the finger electrodes are thinner than the range, it can lead to an increased operating voltage; and if the finger electrodes are thicker than the range, it can affect the stability of the process and increase the material cost.

Preferably, prior to the formation of the p-side finger electrode 93, an optical absorption barrier 95 is formed on the p-type semiconductor layer 50 on which the p-side finger electrode 93 is supposed to be formed. The optical absorption barrier 95 is formed in such a way that it is slightly wider than the p-side finger electrode 93. The light-absorption preventing layer 95 serves to prevent the p-side finger electrode 93 from absorbing light that is generated in the active layer 40. The optical absorption barrier 95 may only serve to reflect part or all of the light generated in the active layer 40, or may only serve to prevent the current from the finger electrode 93 from flowing to immediately below zone of the finger electrode 93, or may serve both functions. To perform these functions, the optical absorption barrier 95 can be composed of a single layer (e.g., $SiO_2$) or a multilayer (e.g., $SiO_2/TiO_2/SiO_2$) that is made of a light-transmitting material having a refractive index lower than that of the p-type semiconductor layer 50, or a DBR or a combination of the single layer and the DBR. In addition, the optical absorption barrier 95 can be composed of a non-conductive material (e.g., a dielectric film such as $SiO_x$, $TiO_x$ or the like). Depending on the structure, a suitable thickness for the optical absorption barrier 95 is between 0.2 μm and 3.0 μm. If the optical absorption barrier 95 is thinner than the range, it cannot function properly; and if the optical absorption barrier 95 is thicker than the range, it can be difficult to deposit the light-transmitting conductive film 60 on the optical absorption barrier 95. Although the optical absorption barrier 95 does not always have to be composed of a light-transmitting material or of a non-conductive material, the effects thereof can be increased by incorporating a light-transmitting dielectric material.

Preferably, following the formation of the optical absorption barrier 95 and prior to the formation of the p-side finger electrode 93, the light-transmitting conductive film 60 is formed on the p-type semiconductor layer 50. The light-transmitting conductive film 60 is formed on the p-type semiconductor layer 50 in such a way that it covers almost the entire p-type semiconductor layer, except for the n-side contact area 31 that is formed by a mesa etching process. As such, the optical absorption barrier 95 is interposed between the light-transmitting conductive film 60 and the p-type semiconductor layer 50, especially in case of a p-type GaN, where it has a poor current spreading capability. Also, when the p-type semiconductor layer 50 is composed of GaN, the light-transmitting conductive film 60 should be incorporated in most cases. For instance, materials such as ITO, Ni/Au or the like can be used for the light-transmitting conductive film 60. After the light-transmitting conductive film 60 is formed, the p-side finger electrode 93 can be formed on the light-transmitting conductive film 60 where the optical absorption barrier 95 is placed.

Following the formation of the n-side finger electrode 81 and the p-side finger electrode 93, a non-conductive reflective film 91 is formed in such a way that the n-side contact area 31 including the n-side finger electrode 81 and the p-type semiconductor layer 50 including the p-side finger electrode 93 are covered overall. The non-conductive reflective film 91 serves to reflect light from the active layer 40 towards the substrate 10 used for the growth or towards the n-type semiconductor layer 30 if the substrate 10 has been removed. Preferably, the non-conductive reflective film 91 also covers the exposed side faces of the p-type semiconductor layer 50 and the active layer 40 that connect the upper face of the p-type semiconductor layer 50 and the upper face of the n-side contact area 31. A person skilled in the art should understand that it is not absolutely necessary for the non-conductive reflective film 91 to cover the entire area over the exposed n-type semiconductor layer 30 as a result of etching and the p-type semiconductor layer 50 on the opposite side of the substrate 10.

The non-conductive reflective film 91 serves as a reflective film, yet it can preferably be composed of a light-transmitting material, for example, a light-transmitting dielectric material such as $SiO_x$, $TiO_x$, $Ta_2O_5$ or $MgF_2$, in order to avoid the light absorption. The non-conductive reflective film 91 can have a variety of structures, including a single dielectric film, for example, made of a light-transmitting dielectric material such as $SiO_x$, a single DBR, for example, including the combination of $SiO_2$ and $TiO_2$, heterogeneous plural dielectric films and any combination of a dielectric film and a DBR, and can have a thickness ranging from 3 to 8 μm, for example. The dielectric film having a refractive index lower than that of the p-type semiconductor layer 50 (e.g., GaN) can reflect part of the light having an incidence angle greater than a critical angle towards the substrate 10. The DBR can reflect a greater amount of light towards the substrate 10, and the DBR can also be designed for a specific wavelength such that it can effectively reflect light in response to the wavelength of the light generated.

Preferably, as shown in FIG. 14 and FIG. 15, the non-conductive reflective film 91 has a double layer structure including a DBR 91a and a dielectric film 91b. As the deposition of the DBR 91a needs to be done with high precision, the dielectric film 91b having a uniform thickness is first formed before the deposition such that the DBR 91b can be prepared in a stable manner, and light reflection can also benefit therefrom.

During the formation of a semiconductor light emitting device according to the present disclosure, a step (step-shape portion) having height difference can be created by a mesa etching process for forming the n-side contact area 31, a component such as the p-side finger electrode 93 or the n-side finger electrode 81 with a step is required, and even after the non-conductive reflective film 91 is formed, it should be subjected to a boring process to make an opening in it as described in detail below. Thus, special attention should be paid during the formation of the dielectric film 91b.

The dielectric film 91b is suitably made of $SiO_2$, and it preferably has a thickness between 0.2 μm and 1.0 μm. If the dielectric film 91b is thinner than the range, it is not enough to fully cover the n-side finger electrode 81 and p-side finger electrode 93 having a height ranging from 2 μm to 3 μm; and if the dielectric film 91b is thicker than the range, the subsequent boring process can be difficult to perform. The dielectric film 91b may be thicker than the following DBR 91a. Moreover, it is necessary to form the dielectric film 91b by a more suitable method for ensuring the reliability of the device. For instance, the dielectric film 91b made of SiO$_2$ is preferably formed by CVD (Chemical Vapor Deposition) and in particular by PECVD (Plasma Enhanced CVD). This is because the steps are created during the formation of the n-side contact area 31 by mesa etching, the p-side finger electrode 93 and the n-side finger electrode 81, and because the CVD is more advantageous than PVD (Physical Vapor Deposition) such as E-beam evaporation to cover the steps. More specifically, when the dielectric film 91b is formed by E-beam evaporation, the dielectric film 91b can be formed more thinly on the lateral faces of the p-side finger electrode 93 and n-side finger electrode 81 having the step, or on the tilted step face generated by mesa etching. Meanwhile, if a thinner dielectric film 91b is formed on the step faces, and especially if the p-side finger electrode 93 and the n-side finger electrode 81 are disposed below the p-side electrode 92 and the n-side electrode 80 respectively as described below, a short might occur between the electrodes. Therefore, in order to ensure insulation, the dielectric film 91b is preferably formed by CVD. In this way, it is possible to secure the reliability of the semiconductor light emitting device, while ensuring those functions as the non-conductive reflective film 91.

The DBR 91a is formed on the dielectric film 91b and composes the non-conductive reflective film 91, together with the dielectric film 91b. For example, the DBR 91a having a repeatedly laminated structure composed of the combination of TiO$_2$/SiO$_2$ is preferably formed by PVD, and in particular by E-beam evaporation, sputtering or thermal evaporation. When the DBR 91a is composed of the combination of TiO$_2$/SiO$_2$, each layer is designed to have an optical thickness of one fourth of a given wavelength, and the number of its combinations is suitably between 4 and 20 pairs. If the number of pairs is smaller than the range, the reflectivity of the DBR 91a may be degraded; and if the number of pairs is larger than the range, the DBR 91a may become excessively thick.

With the non-conductive reflective film 91 is thus formed, the p-side finger electrode 93 and the n-side finger electrode 81 are fully covered by the non-conductive reflective film 91. To enable the p-side finger electrode 93 and the n-side finger electrode 81 to electrically communicate with the p-side electrode 92 and the n-side electrode 80 described below, openings passing through the non-conductive reflective film 91 are formed, and the openings are then filled with an electrode material to form electrical connections 94 and 82. These openings are preferably formed by dry etching or wet etching or both. As the p-side finger electrode 93 and the n-side finger electrode 81 have narrow-width branch portions 98 and 88 respectively, the electrical connections 94 and 82 are preferably formed on the connecting parts 99 and 89 of the p-side finger electrode 93 and the n-side finger electrode 81, respectively. In absence of the p-side finger electrode 93, a number of electrical connections 94 should be formed and connected directly to the light-transmitting conductive film 60 that is prepared on almost the entire face of the p-type semiconductor layer 50. Likewise, in absence of the n-side finger electrode 81, a number of electrical connections 82 should be formed and connected directly to the n-side contact area 31. However, it is difficult to form a satisfactory electrical contact between the p-side electrode 92 and the light-transmitting conductive film 60 and between the n-side electrode 80 and the n-type semiconductor layer 30, and many problems also occur during the manufacturing process. Meanwhile, according to the present disclosure, prior to the formation of the non-conductive reflective film 91, the n-side finger electrode 81 is formed on the n-side contact area 31, and the p-side finger electrode 93 is formed either on the p-type semiconductor layer 50 or preferably on the light-transmitting conductive film 60, and these electrodes are then subjected to heat treatment, thereby making a stable electrical contact between both sides.

Once the electrical connections 94 and 82 are formed, it is desirable to form the p-side electrode 92 and the n-side electrode 80 on the non-conductive reflective film 91. Considering that the p-side electrode 92 and the n-side electrode 80 contribute to reflecting light from the active layer 40 towards the substrate 10, those electrodes are formed over a broad area to be able to cover the entire or almost the entire upper face of the non-conductive reflective film 91, thereby serving as a conductive reflective film. However, the p-side electrode 92 and the n-side electrode 80 are preferably formed at a distance from each other on the non-conductive reflective film 91. As such, there exists a portion on the non-conductive reflective film 91, which is covered neither by the p-side electrode 92 nor by the n-side electrode 80. While the p-side electrode 92 or the n-side electrode 80 may suitably be made of a material having an acceptable reflectance (e.g., Al, Ag or the like), it is preferably made of the combination of the high-reflectance material (e.g., Al, Ag or the like) and Cr, Ti, Ni, Au or any alloy thereof for obtaining a stable electrical contact. The p-side electrode 92 and the n-side electrode 80 serve to supply current to the p-side finger electrode 93 and the n-side finger electrode 81 to connect the semiconductor light emitting device with external equipment; and, by occupying a broad area, to reflect the light from the active layer 40 and/or emit the heat. Therefore, forming both the p-side electrode 92 and the n-side electrode 81 on the non-conductive reflective film 91 makes it possible to minimize the height difference between the p-side electrode 92 and the n-side electrode 80, and is advantageous when the semiconductor light emitting device according to the present disclosure is bonded to a mount part (e.g., a sub-mount, a package or a COB). This advantage becomes more apparent especially when the eutectic bonding method is applied.

As the p-side electrode 92 and the n-side electrode 80 are formed over a broad area on the non-conductive reflective film 91, both the p-side finger electrode 93 and the n-side finger electrode 81 are placed beneath the non-conductive reflective film 91. Here, the p-side finger electrode 93 extends lengthily passing below the n-side electrode 80 placed directly on the non-conductive reflective film 91, and the n-side finger electrode 81 extends lengthily passing below the p-side electrode 92 placed directly on the non-conductive reflective film 91. As the non-conductive reflective film 91 exists between the p-side electrode 92 and the p-side finger electrode 93, and between the n-side electrode 80 and the n-side finger electrode 81, a short between the electrodes 92 and 80 and the finger electrodes 93 and 81 can be prevented. Further, by introducing the p-side finger electrode 93 and the n-side finger electrode 81 as described above into the formation of a flip-chip, it becomes possible to supply current to the semiconductor layer areas of interest, without restriction.

In general, the p-side electrode 92, the n-side electrode 80, the p-side finger electrode 93 and the n-side finger electrode 81 are composed of a plurality of metal layers, respectively. In case of the p-side finger electrode 93, the bottom layer thereof should have a high bonding strength with the light-transmitting conductive film 60. To this end, materials such as Cr or Ti are mainly used, but other materials such as Ni, Ti or TiW can also be used as there are no particular limitations regarding this matter. A person skilled in the art should also understand that Al or Ag having a high reflectance can also be employed for the p-side finger electrode 93 and the n-side finger electrode 81. In case of the p-side electrode 92 and the n-side electrode 80, Au is used for their top layers for wire bonding or for the connection with an external electrode. Meanwhile, in order to reduce the amount of Au used and to complement a relatively low hardness of Au, other material such as Ni, Ti, TiW or W, depending on the specifications required, or Al or Ag, when a high reflectance is required, can be employed between the bottom layer and the top layer. In the present disclosure, since the p-side finger electrode 93 and the n-side finger electrode 81 need to be electrically connected to the electrical connections 94 and 82, Au could be considered for use as the top layers for finger electrodes 93 and 81. However, the inventors found out that it is not appropriate to use Au as the top layers for the p-side finger electrode 93 and the n-side finger electrode 81, because the Au gets easily peeled off due to a weak bonding strength between the Au and the non-conductive reflective film 91 at the time of deposition of the non-conductive reflective film 91 onto the Au top layer. To resolve this problem, other material such as Ni, Ti, W, TiW, Cr, Pd or Mo can be employed in place of Au to form the top layers of the finger electrodes. In this way, the bonding strength between the top layers and the non-conductive reflective film 91 to be deposited on the top layers is retained and the reliability can thus be improved. Further, those metals mentioned above are fully capable of functioning as a diffusion barrier during the formation of an opening in the non-conductive reflective film 91 to create the electrical connection 94, which can be helpful for ensuring the stability of the subsequent processes and the electrical connections 94 and 82.

FIG. 17 is a view illustrating yet another example of the semiconductor light emitting device according to the present disclosure, FIG. 18 is a cross section view taken along line D-D of FIG. 17, and FIG. 19 is a cross section view taken along line E-E of FIG. 17.

In a semiconductor light emitting device 2 according to the present disclosure, as shown in FIG. 18 and FIG. 19, a non-conductive reflective film 91 further includes, in addition to a dielectric film 91b and a DBR 91a, a clad film 91f to be formed on the DBR 91a. Although a large portion of light generated in the active layer 40 is reflected by the dielectric film 91b and the DBR 91a towards an n-side semiconductor layer 30, part of the light is trapped inside the dielectric film 91b and the DBR 91a as they also have a certain thickness, or emitted through the lateral faces of the dielectric film 91b and the DBR 91b. The inventors tried to analyze the relation among the dielectric film 91b, the DBR 91a and the clad film 91f, from the perspective of an optical waveguide. The optical waveguide is a structure that encloses a propagation part of light by a material having a refractive index lower than that of the propagation part of light and guides the light utilizing total reflection. In this regard, if the DBR 91a is considered as the propagation part, the dielectric film 91b and the clad film 91f can be regarded as part of the structure that encloses the propagation part. When the DBR 91a is composed of $SiO_2/TiO_2$, with $SiO_2$ having a refractive index of 1.46 and $TiO_2$ having a refractive index of 2.4, an effective refractive index (which denotes an equivalent refractive index of light that can travel in a waveguide that is made of materials having different refractive indices, and has a value between 1.46 and 2.4) of the DBR 91a is higher than that of the dielectric film 91b composed of $SiO_2$. The clad film 91f is also composed of a material having an effective refractive index lower than that of the DBR 91a. Preferably, the clad film 91f has a thickness which desirably ranges from $\lambda/4n$ to 3.0 µm, in which $\lambda$ denotes a wavelength of the light generated in the active layer 40, and n denotes a refractive index of a material composing the clad film 91f. By way of example, the clad film 91f can be composed of a dielectric such as $SiO_2$ having a refractive index of 1.46. When $\lambda$ is 450 nm (4500 Å), the clad film 91f can be formed in a thickness of 771 Å (4500/4×1.46=771 Å) or more. Considering that the top layer of the DBR 91a made of multiple pairs of $SiO_2/TiO_2$ can be composed of a $SiO_2$ layer having a thickness of $\lambda/4n$, it is desirable that the clad film 91f is thicker than $\lambda/4n$ to be distinguished from the top layer of the DBR 91a that is placed beneath the clad film 91f. Although it is not desirable for the top layer of the DBR 91a to be too thick (e.g., 3 µm or more), imposing a burden on the subsequent boring process and only increasing the material cost without contributing to the improvement of the efficiency, it is not impossible, depending on the case, to make the top layer as thick as 3.0 µm or more. When the DBR 91a comes in direct contact with the p-side electrode 92 and the n-side electrode 80, part of the light travelling through the DBR 91a may be affected by the p-side electrode 92 and the n-side electrode 80 and then absorbed. However, interposing the clad film 91f having a refractive index lower than that of the DBR 91a between the p- and n-side electrodes (92, 80) and the DBR 91a can minimize the partial absorption of the light traveling through the DBR 91a by the p-side electrode 92 and the n-side electrode 80, thereby increasing the efficiency of light extraction. Accordingly, the clad film 91f should generally have at least a thickness corresponding to the wavelength of light to achieve the effect described above, and therefore it preferably has a thickness of at least $\lambda/4n$. Meanwhile, if there is a big difference between the refractive index of the DBR 91a and the refractive index of the clad film 91f, the DBR 91a may restrict light more strongly such that a thinner clad film 91f could be used. However, if the difference between the refractive indices is small, the clad film 91f needs to be sufficiently thick to obtain the effect described above. Thus, the thickness of the clad film 91f is determined with full consideration of a difference between the refractive index of a material constituting the clad film 91f and the effective refractive index of the DBR 91a. For instance, if the clad film 91f is composed of $SiO_2$ and the DBR 91a is composed of $SiO_2/TiO_2$, a suitable thickness for the clad film 91f will be at least 0.3 µm to be distinguished from the top layer of the DBR 91a composed of $SiO_2$. On the other hand, the upper limit of the thickness of the clad film 91f is preferably between 1 µm and 3 µm, not to impose any burden on the subsequent boring process.

The clad film 91f is not particularly limited as long as its refractive index is lower than the effective refractive index of the DBR 91a, and can be composed of a metal oxide such as $Al_2O_3$, a dielectric film such as $SiO_2$ or SiON, or other material such as MaF or CaF. If a difference in the refractive indices is small, the clad film should be made thicker to obtain the desired effect. Also, in case of using $SiO_2$ for the clad film, it is possible to use $SiO_2$ having a refractive index lower than 1.46 to increase the efficiency.

One can envisage that the dielectric film 91b can be omitted from the non-conductive reflective film. Although not desirable in terms of an optical waveguide, there is no reason to exclude the configuration of the non-conductive reflective film 91 composed of the DBR 91a and the clad film 91f, when the overall technical spirit of the present disclosure is taken into consideration. Also, one can envisage that the non-conductive reflective film 91 may have a TiO$_2$ dielectric film in replace of the DBR 91a. Further, one can envisage that the clad film 91f can be omitted from the non-conductive reflective film, if the DBR 91a includes a SiO$_2$ layer on the top thereof.

The non-conductive reflective film 91, which is composed of the DBR 91a having a high effective reflectance, and the dielectric film 91b and the clad film 91f, each having a low reflectance, disposed on the top and bottom of the DBR 91a, respectively, serves as an optical waveguide, and preferably has an overall thickness ranging from of 3 μm to 8 μm. Also, the non-conductive reflective film 91 preferably has an inclined face 91m at the edge. This inclined face 91m can be formed, for example, by a dry etching process. Among light rays that are incident on the non-conductive reflective film 91 that serves as an optical waveguide, the light rays that are incident on the non-conductive reflective film 91 at right angles or almost at right angles are well reflected towards the substrate 10, but some light rays including those that are incident on the non-conductive reflective film 91 at an oblique angle are not reflected towards the substrate 10 and instead can be trapped inside the DBR 91a that serves as a propagation part, and then can be propagated towards the lateral face. As such, the light rays propagated towards the lateral surface of the DBR 91a are either emitted to the outside or reflected towards the substrate 10, at the inclined face 91m of the edge of the non-conductive reflective film 91. That is to say, the inclined face 91m at the edge of the non-conductive reflective film 91 serves as a corner reflector and contributes to the improved luminance of the semiconductor light emitting device. The inclined face 91m is suitably at an angle ranging from 50 to 70 degrees, to facilitate the light reflection towards the substrate 10. The inclined face 91m can easily be formed by wet etching or dry etching, or both.

FIG. 20 is a view illustrating a state of two semiconductor light emitting devices before they are divided into individual semiconductor light emitting devices, during the manufacturing process of a semiconductor light emitting device; and FIG. 21 is a view illustrating a state of two semiconductor light emitting devices after they are divided into individual semiconductor light emitting devices, during the manufacturing process of a semiconductor light emitting device. For reference, those semiconductor light emitting devices 3, shown in FIG. 20 and FIG. 21 for explaining the manufacturing process, are in a state where none of the p-side electrode 92, n-side electrode 80 and bonding pad 97 is formed.

Usually a semiconductor light emitting device is first prepared in a wafer form including a plurality of semiconductor light emitting devices, and then divided into individual semiconductor light emitting devices by cutting, such as breaking, sawing, or scribing-and-breaking. In the scribing-and-breaking operation, the scribing process employs a laser and can be performed by focusing the laser onto the substrate side including the surface and the interior of the substrate of the semiconductor light emitting device. In this scribing process employing the laser, the semiconductor light emitting device 3 is preliminarily cut along the boundary G of the edge of the semiconductor light device 3, i.e., along the boundary G between the semiconductor light emitting device 3 and another neighboring semiconductor light emitting device 3. The preliminarily cut semiconductor light emitting devices are completely divided into individual semiconductor light emitting devices through the breaking process that is performed following the scribing process. The breaking process is performed by applying an external force along the boundary G between the semiconductor light emitting device 3 and another neighboring semiconductor light emitting device 3, for example, in the direction of the substrate 10 indicated by an arrow F in FIG. 20, or in the opposite direction thereof. In this breaking process, the substrate 10 and the semiconductor layers 20, 30 40 and 50, which are crystalline, can be cut precisely along the boundary G; while the non-conductive reflective film 91 over the p-type semiconductor layer 50, which is non-crystalline, cannot be cut precisely along the boundary G and, in the areas around the edge of the non-conductive reflective film 91, it is likely to sustain damage such as crack generation thereto. The damage of the areas around the edge of the non-conductive reflective film 91 may lead to poor yields due to those appearance defects. Preferably, during the manufacturing of a semiconductor light emitting device, a plurality of semiconductor light emitting devices is prepared in a wafer form, and then, prior to the scribing and braking processes using a laser for dividing the semiconductor light emitting devices into individual ones, a certain area H of the non-conductive reflective film 91 around the boundary G between a semiconductor light emitting device and another neighboring semiconductor light emitting device is eliminated. In terms of the individual semiconductor light emitting device, the certain area H of the non-conductive reflective film 91 to be eliminated along the boundary G of the semiconductor light emitting device 3 corresponds to an edge area of the non-conductive reflective film 91. The elimination of a certain area H of the non-conductive reflective film 91 around the boundary G can also indicate that, before the semiconductor light emitting devices are divided into individual ones, the non-conductive reflective film 91 of one semiconductor light emitting device and the non-conductive reflective film 91 of another neighboring semiconductor light emitting device are spaced apart from each other. With a part of the areas of the edge of the non-conductive reflective film 91 being eliminated, even if the subsequent scribing and breaking processes may be performed using a laser, the appearance defect caused by the damaged edge of the non-conductive reflective film 91 of each semiconductor light emitting device can be avoided, thereby increasing yields. For example, the elimination of a certain area H of the non-conductive reflective film 91 can be carried out by dry etching, and it should be performed prior to the breaking process in the overall semiconductor manufacturing process. However, when the openings passing through the non-conductive reflective film 91 to form electrical connections 94 and 82 are formed by dry etching, it is preferable to perform the elimination at the same time. Although the inclined face 91m serving as a corner reflector can be obtained by a separate etching process, the inclined face 91m can be formed simultaneously in a process of eliminating the edge area of the non-conductive reflective film 91 to avoid damage, by etching the edge portion of the non-conductive reflective film 91 of an individual semiconductor light emitting device.

As shown in FIG. 17 and FIG. 19, a bonding pad 97 can be present on the p-side electrode 92 and on the n-side electrode 80 respectively, as a part of each of the p-side electrode 92 and the n-side electrode 80. The top face of the bonding pad 97 on the p-side electrode 92 has the same height as the top face of the bonding pad 97 on the n-side electrode 80. That is to say, the top face of the bonding pad 97 on the p-side electrode 92 and the top face of the bonding pad 97 on the n-side electrode 80 are on the same plane. When a semiconductor light emitting device is coupled with external equipment by, for example, the eutectic bonding method, those bonding pads 97 allow the p-side electrode 92 and the n-side electrode 80 to have an equal final height to thus avoid any tilting on the mount part, provide a broad and planar coupling face to thus obtain an excellent bonding strength, and dissipates the heat from the inside of the semiconductor light emitting device to the outside. A plurality of bonding pads 97 can be present on the p-side electrode 92 and on the n-side electrode 80, respectively, and the plurality of bonding pads 97 are preferably formed on the portions where the n-side finger electrodes 81 and the p-side finger electrodes 93 are not overlapped, i.e., between each of the n-side finger electrodes 81 and the p-side finger electrodes 93. In other words, the bonding pads 97 are formed on the areas of the p-side electrode 92 and on the n-side electrode 80, except on the p-side finger electrodes 93 corresponding to the upper most protruded portion and on the n-side finger electrodes 81 corresponding to the lower most recessed portion. In addition, the bonding pad 97 can have a double layer structure including an underlying spacer layer 97a and a bonding layer 97b overlying the spacer layer 97a, and have a total thickness ranging from 5 µm to 6 µm, for example. In one example, the spacer layer 97a may be composed of a metal layer including Ni, Cu or a combination thereof, and the bonding layer 97b may be composed of an eutectic bonding layer including a Ni/Sn, Ag/Sn/Cu, Ag/Sn, Cu/Sn or Au/Sn combination and having a thickness of about several µm. The spacer layer 97a can serve as a wetting layer and as a diffusion barrier for a solder used in the eutectic bonding, and can also reduce the cost burden as compared with a case where the bonding pad 97 is entirely formed of an eutectic bonding layer 97b containing expensive Au. To match the final height of the bonding faces during bonding (e.g., eutectic bonding), the bonding pad 97 is preferably formed to be taller than the most protruded portion of the p- and n-side electrodes 92 and 80, namely, the height of the upper portion of the p-side finger electrode, by 1 to 3 µm. Accordingly, during the bonding operation, excellent bonding results are obtained between the semiconductor light emitting device and the mount part, and heat dissipation of the semiconductor light emitting device is facilitated. Here, the spacer layer 97a and the bonding layer 97b can be formed by various methods, such as plating, E-beam evaporation, thermal evaporation or the like.

Referring back to FIG. 14 and FIG. 15, all areas of the n-type semiconductor layer 30, except the n-side contact area 31, are preferably covered with the active layer 40 and the p-type semiconductor layer 50. That is to say, for the semiconductor light emitting device 100, the target etching area is limited to the n-side contact area 31, and there is no other area including the edges to be etched. Those lateral faces around the semiconductor light emitting device 100 are all cut faces obtained by the scribing-and-braking process or the like. As such, the area of the active layer 40 generating light increases and the light extraction efficiency is thus improved. Moreover, the step faces produced from the etching process are minimized; namely, those step faces are limited to the exposed lateral faces of the active layer 40 and the p-type semiconductor layer 50 that connect the top face of the p-type semiconductor layer 50 with the top face of the n-side contact area 31. These exposed lateral faces of the active layer 40 and the p-type semiconductor layer 50 are the portions where it is hard, in particular, to deposit the DBR 91a constituting the non-conductive reflective film 91 during the formation of the non-conductive reflective film 91. Consequently, the DBR 91a on the exposed lateral faces of the active layer 40 and the p-type semiconductor layer 50 may have relatively lower reflection efficiency. By minimizing the exposed lateral faces of the active layer 40 and the p-type semiconductor layer 50, it is possible to minimize areas having low reflection efficiency in the DBR 91a, thereby increasing the reflection efficiency as a whole.

FIG. 22 is a view illustrating still another example of the semiconductor light emitting device according to the present disclosure, and FIG. 23 is a cross section view taken along line A-A' of FIG. 22. The first feature of this embodiment is that finger electrodes 93 on the p-type semiconductor layer 50 are separated from each other, but after each electrical connection is set, they are then connected to each other by an electrode 92. The electrode 92 serves to supply current to those finger electrodes 93, and is capable of reflecting light, dissipating heat and/or connecting the device to outside. Although it is preferred that the finger electrodes 93 are all separated, separating at least two finger electrodes 93 can remove a branched part that connects those finger electrodes 93 with each other, thereby making it possible to reduce an unequal height on top of the device. The second feature of this embodiment is that the finger electrodes 93 are stretched out along one lateral (C) direction of the device. For instance, in FIG. 22, they are stretched out towards the electrode 80 from the electrode 92. With these long stretched finger electrodes 93, the device may be placed without leaning when it is overturned on a mount part (e.g., a sub-mount, a package, or a COB (Chip on Board)). In this regard, it is preferable to have the finger electrodes 93 as long as possible within the marginal space in the construction of a device. In this disclosure, as the finger electrodes 93 underlie the non-conductive reflective film 91, they may be extended farther, past the electrode 80. The third feature of this embodiment is that the electrode 80 is disposed above the non-conductive reflective film 91. The electrode 80 is connected to a finger electrode 81 through an electrical connection 82. The electrode 80 has the same functions as the electrode 92. With such a construction, the side where the electrode 80 is placed has an increased height as compared with FIG. 3, such that a height difference between the sides of the electrode 92 and the electrode 80 is reduced, being advantageous for coupling the device with the mount part. This advantage becomes more apparent especially when the eutectic bonding process is employed. The fourth feature of this embodiment is that those finger electrodes 81 can be arranged in a similar way as those finger electrodes 93. The fifth feature of this embodiment is that an auxiliary heat-dissipating pad 97 is provided. The auxiliary heat-dissipating pad 97 serves to dissipate heat from inside the device to outside and/or to reflect light, while it also electrically isolates the electrode 92 and/or the electrode 80, thereby preventing any electrical contact between the electrode 92 and the electrode 80. Further, this auxiliary heat-dissipating pad 97 may be used for bonding. In particular, when the auxiliary heat-dissipating pad 93 is electrically isolated from both the electrode 92 and the electrode 80, even if it accidently comes into an electrical contact with either of the electrodes 92 and 80, the overall electrical operations of the device will not be affected thereby. A person skilled in the art would understand that all of the five features described above are not necessarily required of this embodiment.

FIG. 24 is a view illustrating still another example of the semiconductor light emitting device according to the present disclosure, in which auxiliary heat-dissipating pads 121, 122, 123 and 124 are present between the electrode 92 and the electrode 80. Preferably, the auxiliary heat-dissipating pads 121, 122, 123 and 124 are interposed between the finger electrodes 92, or between a finger electrode 92 and a corresponding finger electrode 81. Without the auxiliary heat-dissipating pads 121, 122, 123 and 124 formed on the finger electrodes 92, the front face of the device and the mount part are bonded better during bonding (e.g. eutectic bonding), which is favorable in terms of heat dissipation of the device. The auxiliary heat-dissipating pads 121 and 122 are separated from the electrodes 92 and 80, while the auxiliary heat-dissipating pad 123 is connected to the electrode 92 and the auxiliary heat-dissipating pad 124 is connected to the electrode 80.

FIG. 25 is a view illustrating still another example of the semiconductor light emitting device according to the present disclosure, in which the finger electrode 93 is extended below the electrode 80 (past the reference line B). By introducing the finger electrode 93 onto the p-type semiconductor layer 50, a flip-chip is constructed in such a way that current can be supplied without restrictions to the device area needed. There are two electrical connections 94's, which can be placed wherever necessary, according to the requirements for diffusing the current. The electrical connection 94 on the left hand side may be omitted. The electrode 92 also serves as an auxiliary heat-dissipating pad 97 (see FIG. 22). Even when the finger electrode 93 is not available, current can still be supplied by connecting the electrical connection 94 directly to the light-transmitting conductive film 60, but current cannot be supplied directly to the p-type semiconductor layer 50 below the electrode 80. Introducing the finger electrode 93, however, enables to supply current even below the electrode 80 supplying current to the n-type semiconductor layer 30. The same also applies to the electrical connection 82.

FIG. 26 is a view illustrating still another example of the semiconductor light emitting device according to the present disclosure, in which the non-conductive reflective film 91 is made up of a multi-layer dielectric film 91c, 91d and 91e. For example, the non-conductive reflective film 91 can include a dielectric film 91c made of $SiO_2$, a dielectric film 91d made of $TiO_2$, and a dielectric film 91e made of $SiO_2$, to serve as a reflective film. Preferably, the non-conductive reflective film 91 is designed to include a DBR structure. Considering that the manufacture of the semiconductor light emitting device according to the present disclosure requires a structure such as finger electrodes 93 or finger electrodes 91, and a process for forming electrical connections 94 or electrical connections 82 even after the non-conductive reflective film 91 has been formed, extra caution should be given particularly for forming the dielectric film 91c made of $SiO_2$ as it can affect the reliability of the device (e.g. leakage current may occur) after the semiconductor light emitting device is finished. To this end, firstly, the dielectric film 91c should have a thickness greater than those of the dielectric films 91d and 91e that come after the dielectric film 91c. Secondly, the dielectric film 91c needs to be prepared in a more appropriate way for ensuring the reliability of the device. By way of example, the dielectric film 91c made of $SiO_2$ can be obtained by CVD (Chemical Vapor Deposition), but most of all (preferably) PECVD (Plasma Enhanced CVD); the repeating, laminated structure of dielectric film 91d and the dielectric film 91e made of $TiO_2/SiO_2$ DBR can be obtained by PVD (Physical Vapor Deposition), but most of all (preferably) electron beam evaporation, sputtering or thermal evaporation, thereby ensuring the reliability of the semiconductor light emitting device according to the present disclosure as well as the performances as the non-conductive reflective film 91. For step coverage, i.e. for the coverage of a mesa etched area, CVD is known to prevail over PVD, especially electron beam evaporation.

FIG. 27 is an enlarged view of the area where an electrical connection is formed, which shows the light-transmitting conductive film 60, the finger electrode 93 disposed on the light-transmitting conductive film 60, the non-conductive reflective film 91 encompassing the finger electrode 93, the electrode 92, and the electrical connection 94 connecting the finger electrode 93 with the electrode 92. In general, a plurality of metal layers is provided for forming electrodes, finger electrodes and bonding pads in the semiconductor light emitting device. The bottom layer should have an acceptable bonding strength with the light-transmitting conductive film 60. It is mainly made of a material such as Cr or Ti, but Ni, Ti, TiW or the like can also be used since its material is not particularly limited. In case of the top layer for wire bonding or for the connection with an external electrode, Au is typically used. Meanwhile, in order to reduce the amount of Au used and to complement a relatively low hardness of Au, it is possible to employ, between the bottom layer and the top layer, other materials such as Ni, Ti, TiW or W, depending on the specifications required, or Al or Ag, when a high reflectance is required. In the present disclosure, however, since the finger electrode 93 needs to be electrically connected to the electrical connection 94, Au can be considered for use as the top layer for finger electrode 93. Nevertheless, the inventors have learned that it is not appropriate to use Au for the top layer for the finger electrode 93, because the Au gets easily peeled off due to a weak bonding strength between the Au and the non-conductive reflective film 91 at the time of deposition of the non-conductive reflective film 91 onto the Au top layer. To resolve this problem, the top layer of the finger electrode 93 can be formed of other materials such as Ni, Ti, W, TiW, Cr, Pd or Mo, in place of Au. In this way, the bonding strength between the top layer and the non-conductive reflective film 91 to be deposited on the top layer is retained and the reliability of the device can thus be improved. Further, those metals mentioned above are fully capable of acting as a barrier during the formation of an opening in the non-conductive reflective film 91 for the electrical connection 94, which can then be useful for ensuring the stability of the subsequent processes and the electrical connections.

FIG. 28 is a view illustrating still another example of the semiconductor light emitting device according to the present disclosure, which further includes phosphors 220. The phosphor 220, in combination with an epoxy resin, forms an encapsulant 230. The semiconductor light emitting device is placed at a reflective cup 210. The electrodes 80 and 92 are electrically connected to outside, by means of a conductive adhesive 240 and 250, respectively. The phosphor 220 can be coated conformally, or can be applied directly, or can be disposed at a certain distance away from the semiconductor light emitting device. The light emitted from the active layer 40 is absorbed by the phosphor 220 and converted to a light L1 of longer or shorter wavelength before traveling to outside, but part of the light L2 remains within the semiconductor light emitting device or is reflected from the reflective cup 210 and then returns into the semiconductor light emitting device where it is destroyed, thereby impairing the efficiency of the semiconductor light emitting device. In case that the non-conductive reflective film 91 has a DBR 91-1, the reflection efficiency of the DBR 91-1 depends on the wavelength of the light. For instance, suppose that the light emitting from the active layer 40 is blue light having a wavelength of 450 nm, and that the DBR 91-1 is made of SiO$_2$/TiO$_2$ combination, where SiO$_2$ has a refractive index n$_1$ and TiO$_2$ has a wavelength of n$_2$, the thickness of SiO$_2$ is adapted by 450 nm/4n$_1$, and the thickness of TiO$_2$ is adapted by 450 nm/4n$_2$. However, when the phosphor 220 is a yellow phosphor (e.g.: YAG:Ce, (Sr,Ca,Ba)$_2$SiO$_4$:Eu), the phosphor 220 will have a wavelength of 560 nm, and as a result thereof, the efficiency of the DBR 91-1 adapted to the blue light will be substantially lowered. This problem can be relieved by introducing more DBRs 91-2 into the non-conductive reflective film 91, which are adapted to the wavelength of the phosphor 220 present in the semiconductor light emitting device. In summary, the DBR 91-1 is designed based on $\lambda_{Active}/4n_1$, $\lambda_{Active}/4n_2$ (wherein, $\lambda_{Active}$ is the wavelength of the active layer 40, and n$_1$ and n$_2$ are refractive indexes of the DBR 91-1 materials), and the DBR 91-2 is designed based on $\lambda_{Phosphor}/4n_1$, $\lambda_{Phosphor}/\lambda 4n_2$ (wherein, $\lambda_{Phosphor}$ is the wavelength of the phosphor 220, and n$_1$ and n$_2$ are refractive indexes of the DBR 91-2 materials). The expression "is designed based on" herein is not intended to mean that the DBR 91-1 must have a thickness following this criteria. Rather, the DBR 91-1 may have a larger or smaller thickness than the reference thickness, when an occasion arises. Nevertheless, such an occasion does not change the fact that the DBR 91-1 should be designed based on the $\lambda_{Active}/4n_1$, $\lambda_{Active}/4n_2$. When the phosphor 220 has several wavelengths of blue, green, orange, red and the like, additional DBR 91-2 may also be added accordingly. Needless to say, the material for the DBR 91-1 and the material for the DBR 91-2 may be partially or entirely different from each other. The DBR 91-1 and the DBR 91-2 comprising from 2 to 10 periods can be ready for any desired wavelength. However, this does not necessarily imply that any DBR comprising less or more periods cannot serve its performance.

FIG. 29 is a view illustrating still another example of the semiconductor light emitting device according to the present disclosure, which further includes a DBR 91-3. This is the case where the phosphor 220 includes two materials having different wavelengths. DBR 91-2 is designed based on $\lambda_{Phosphor1}/4n_1$, $\lambda_{Phosphor1}/4n_2$, and the DBR 91-3 is designed based on $\lambda_{Phosphor2}/4n_1$, $\lambda_{Phosphor2}/4n_2$. Typically, when $\lambda_{Phosphor1} > \ldots > \lambda_{Phosphorn}$ (wherein n is a positive integer), arranging these DBRs in the non-conductive reflective film 91 becomes an issue. Various arrangements can be possible, e.g., they can be arranged from the p-type semiconductor layer 50 in order of longest wavelength to shortest, or vice versa. Also, more generally, it is possible to design DBRs of several wavelength bands, taking the light from the active layer 40 and/or the wavelength of the phosphor into consideration. If a DBR designed for a relatively shorter wavelength is arranged closer to the p-type semiconductor layer 50, the light of this shorter wavelength may be farther from the finger electrode 93 and the electrode 92, and thus, the absorption of the light by the finger electrode 93 and the electrode 92 is virtually prevented. Another possible advantage is that if a DBR designed for a relatively longer wavelength is arranged closer to the p-type semiconductor layer 50, the reflectivity for the light which does not enter in a direction perpendicular to the DBR but enters at an angle with respect to the DBR would be increased.

It is also possible to arrange a DBR designed for the shortest wavelength to be closest to or farthest from the p-type semiconductor 50 and then put the other two DBRs to be intersected or mixed, or in any diverse way if necessary.

The non-conductive reflective film 91 may become too thick if DBRs of different wavelengths are provided. Thus, if two materials of the phosphor 220 do not differ considerably in terms of the wavelength, it is also possible to design DBRs for those two materials. For example, DBRs can be designed based on $((\lambda_{Phosphor1}+\lambda_{Phosphor2})/2)/4n_1$, $((\lambda_{Phosphor1}+\lambda_{Phosphor2})/2)/4n_2$. When the phosphor has wavelengths of 550 nm, 580 nm, and 600 nm, a DBR can have the above design for 580 nm and 600 nm because of a smaller difference in the wavelength.

Moreover, when the phosphor has wavelengths of 550 nm, 580 nm, and 600 nm, a DBR can be designed for thicker wavelengths 580 nm and 600 nm together, which in turn enables to reduce the overall thickness of the non-conductive reflective film 91.

Also, as described above, when one designs DBRs, DBRs can end up being slightly longer than $\lambda$, that is, slightly thicker than the reference, instead of being adapted to the precise sizes of $\lambda/4n_1$, $\lambda/4n_2$. However, when such a DBR is introduced into a flip-chip, the thickness of the non-conductive reflective film 91 may increase, and if applicable, it can become difficult to form the electrical connection 94. To relieve such problems, instead of increasing both thicknesses $\lambda/4n_1$ and $\lambda/4n_2$, only the thickness $\lambda/4n_2$ may be increased. Even if both thicknesses $\lambda/4n_1$ and $\lambda/4n_2$ are increased, it is still possible to make the thickness $\lambda/4n_2$ relatively larger. For instance, when blue light is emitted from the active layer 40, its wavelength is 450 nm. If the DBR is made of the SiO$_2$/TiO$_2$ combination, with SiO$_2$ having a refractive index of n$_1$ (=1.46) and TiO$_2$ having a wavelength of n$_2$ (=2.4), SiO$_2$ is adapted to have a thickness based on 450 nm/4n$_1$, and TiO$_2$ is adapted to have a thickness based on 450 nm/4 n$_2$. This is because the wavelength is changed from 450 nm to 500 nm (in case of designing DBRs towards the longer wavelengths), a larger refractive index results in a smaller change in the thickness. While its effects on the improvement of the reflectivity is smaller than the case where both thicknesses are adapted to 500 nm, it has other advantages that an increase in the thickness of the non-conductive reflective film 91 is relatively reduced, and the reflectivity is enhanced. This embodiment is applicable even when no phosphor 220 is introduced, as well as to the DBR 91-2 to which the phosphor 220 is introduced.

FIG. 30 graphically shows reflectivity as a function of wavelengths of aluminum (Al), silver (Ag) and gold (Au). One can see that while the reflectivities of Al and Ag are acceptable at a lower wavelength band, the reflectivity of Au is even better at a wavelength band of 600 nm or more. To apply this to the semiconductor light emitting devices illustrated in FIG. 28 and FIG. 29, when the phosphor 220 includes a red phosphor, it is possible to treat the light having a shorter wavelength than this by the non-conductive reflective film 91, and to reflect a red emission or a wavelength band of 600 nm or more using Au that is provided to the bottom layer of a lower area of the electrode 92. In addition to this, it is also possible to provide a DBR, adapted to the red light, in the non-conductive reflective film 91. Further, Au may be included in the bottom layer or a lower area of the electrode 80, finger electrode 81 or finger electrode 93. The term "lower area" herein is intended to mean that other metal such as Cr or Ti that has a relatively better adhesive strength than Au can be added, in a very small thickness, to the bottom layer, while still retaining the reflective performance of Au. It should be understood that the technical ideas presented in FIG. 28 to FIG. 30 are also applicable even if the finger electrodes 93 are not available, and that the present disclosure is not to be regarded simply as a combination of the number of features suggested in this disclosure. Needless to say, in addition to the electrodes mentioned above, the auxiliary heat-dissipating pad 97 illustrated in FIG. 22 and FIG. 24 as well as those auxiliary heat-dissipating pads 121, 122, 123 and 124 can also be configured as described above. The Au-containing electrode 92, auxiliary heat-dissipating pad 97, auxiliary heat-dissipating pads 121, 122, 123 and 124, finger electrode 93, electrode 80 and finger electrode 81 on the opposite side of the p-type semiconductor layer 50 are referred to as reflective metal layers.

FIG. 31 is a view illustrating still another example of the semiconductor light emitting device according to the present disclosure, in which the semiconductor light emitting device includes a substrate 10, a buffer layer 20 grown on the substrate 10, an n-type semiconductor layer 30 grown on the buffer layer 20, an active layer grown on the n-type semiconductor layer 30, generating light via electron-hole recombination, and a p-type semiconductor layer 50 grown on the active layer 40. The semiconductor light emitting device further includes a light-transmitting conductive film 60 formed on the p-type semiconductor layer 50, a non-conductive reflective film 91 formed on the light-transmitting conductive film 60 to reflect light from the active layer 40 towards the substrate 10 used for growth or towards the n-type semiconductor layer 30 if the substrate 10 has been removed, an electrode 80 for providing electrons to the n-type semiconductor layer 30, an electrode 92 for providing holes to the p-type semiconductor layer 50, and a finger electrode 81 stretched into the n-type semiconductor layer 30 and electrically connected to the electrode 80. Moreover, the semiconductor light emitting device further includes an electrical connection 94 passing through the non-conductive reflective film 91 to connect the electrode 92 and the light-transmitting conductive film 60, and another non-conductive reflective film 191 interposed between the p-type semiconductor layer 50 and the light-transmitting conductive film 60 below the electrical connection 94 to reflect light from the active layer 40 towards to the n-type semiconductor layer 30.

The non-conductive reflective film 91 can be formed on the exposed n-type semiconductor layer 30 after being etched and on a part of the electrode 80.

The presence of the non-conductive reflective film 191 between the p-type semiconductor layer 50 and the light-transmitting conductive film 60 below the electrical connection 94 prevents the non-conductive reflective film 91 from covering the electrical connection 94, such that it is highly possible that the optical efficiency may not be decreased, but rather can be improved.

While serving as a reflective film, the non-conductive reflective film 91 and the non-conductive reflective film 191 are preferably composed of a light-transmitting material, for example, a light-transmitting dielectric material such as $SiO_x$, $TiO_x$, $Ta_2O_5$ or $MgF_2$, in order to avoid the absorption of light. When the non-conductive reflective film 91 and the non-conductive reflective film 191 are composed of $SiO_x$, their refractive indexes are lower than that of the p-type semiconductor layer 50 (e.g., GaN) such that they can reflect part of the light having an incidence angle greater than a critical angle towards the semiconductor layers 30, 40 and 50. In addition, the non-conductive reflective film 91 and the non-conductive reflective film 191 can be made up of a DBR. In such case, they are able to reflect a greater amount of light towards the semiconductor layers 30, 40 and 50.

The light-transmitting conductive film 60 serves to improve the current diffusion capacity, especially when the p-type semiconductor layer 50 is composed of GaN. As such, it can be made of a material such as ITO, Ni/Au or the like.

FIG. 32 is a view illustrating still another example of the semiconductor light emitting device according to the present disclosure, in which a finger electrode 93 is stretched out between the non-conductive reflective film 91 and the light-transmitting conductive film 60, for facilitating the supply of current (hole, to be more accurate) to the p-type semiconductor layer 50 from the electrode 92. The finger electrode 93 is electrically connected to the electrode 92, via the electrical connection 94 that passes through the non-conductive reflective film 91 in the vertical direction. Without the finger electrode 93, a number of electrical connections 94 will have to be formed to connect the electrode 92 directly to the light-transmitting conductive film 60 formed on almost the entire face of the p-type semiconductor layer 50. In such case, however, it is not easy to obtain an acceptable electrical contact between the electrode 92 and the light-transmitting conductive film 60, and problems may occur during the manufacturing process.

Figure 33:
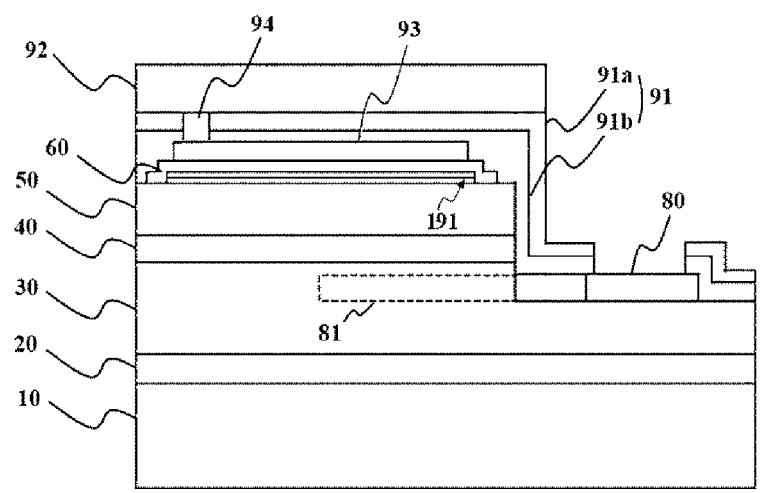
FIG. 33 is a view illustrating still another example of the semiconductor light emitting device according to the present disclosure.

FIG. 33 is a view illustrating still another example of the semiconductor light emitting device according to the present disclosure, in which the non-conductive reflective film 191 is stretched out between the light-transmitting conductive film 60 and the p-type semiconductor layer 50 to the extent that it underlies the electrical connection 94 as well as the finger electrode 93. With this long stretched non-conductive reflective film 191 until it underlies the finger electrode 93, it is possible to prevent the absorption of light by the finger electrode 93 and further to improve the optical efficiency.

Figure 34:
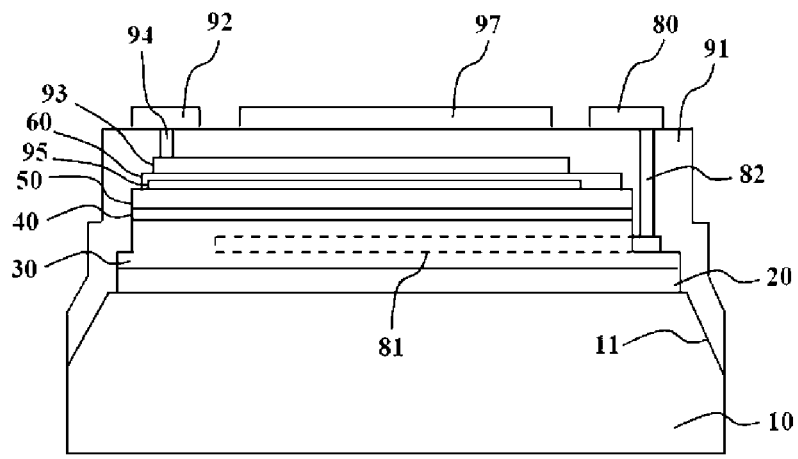

FIG. 34 and FIG. 35 are views, each illustrating still another example of the semiconductor light emitting device according to the present disclosure, in which the non-conductive reflective film 19, unlike the one in the semiconductor light emitting device shown in FIG. 13, is formed up to a lateral face 11 of the substrate 10. As shown in FIG. 35, when the semiconductor light emitting device is mounted on a lead frame or on a PCB 2000, even if an opaque bonding material 111 mainly composed of a metal reaches the lateral face 11 of the substrate or the growth substrate 10, the non-conductive reflective film 91 is formed up to the lateral face 11 of the substrate 10, thereby making it possible to prevent the absorption of light by the bonding material 111. This configuration is not limited to the semiconductor light emitting device shown in FIG. 13, but it can be applied to any semiconductor light emitting device using the non-conductive reflective film 91, including those semiconductor light emitting devices shown in FIG. 2 and FIG. 18.

FIG. 36 to FIG. 38 illustrate one example of a process for manufacturing the semiconductor light emitting device shown in FIG. 34. First, referring to FIG. 36, the process prior to the formation of the non-conductive reflective film 91 will be explained. A plurality of semiconductor layers 30, 40 and 50 are formed on the substrate 10, and then an isolation process takes place to separate them into individual semiconductor light emitting devices A and B. After that, these semiconductor light emitting devices are subjected to the conventional semiconductor manufacturing process, in order to produce an optical absorption barrier 95, a light-transmitting conductive film 50 and finger electrodes 81 and 93. If necessary, the process for separating the semiconductor layers into individual semiconductor light emitting devices A and B can be omitted. As will be described below, the isolation process itself can be a process for forming a groove 12 in the substrate 10. Moreover, if necessary, these semiconductor processes may be carried out in different order.

Next, as shown in FIG. 37, a groove 12 is formed in the substrate 10 to expose the lateral face 11 of the substrate 10. This process can be accomplished by etching, sawing, laser scribing or the like. For instance, a groove 12 having a depth between 10 and 50 μm can be formed.

Next, as shown in FIG. 38, the non-conductive reflective film 91 is formed according to the method described above. If necessary, electrical connections 82 and 94, electrodes 80 and 92, and an auxiliary heat-dissipating pad 97 are formed. Afterwards, those individual semiconductor light emitting devices A and B are separated into a shape as shown in FIG. 34, by breaking, sawing or scribing-and-braking.

The process for forming the groove 12 may be performed immediately after the formation of the plurality of semiconductor layers 30, 40 and 50. In such case, an extra isolation process may be omitted. Therefore, the process for forming the groove 12 may be performed at any time as long as it falls prior to the formation of the non-conductive reflective film 91.

FIG. 39 is a view illustrating still another example of the semiconductor light emitting device according to the present disclosure, in which a plating film 112 may additionally be provided on the electrodes 80 and 92 in order to prevent the bonding material 111 from climbing up to the semiconductor light emitting device. Preferably, the plating film has a height of 10 μm or more. More preferably, it has a height of 20 μm or more. Such a height is not easily obtained by sputtering or electron-beam deposition commonly used for forming electrodes 80 and 92. If the non-conductive reflective film 91 is formed on the lateral face of the growth substrate 10, the plating film 112 may have a lower height. The use of a metal like Ni enables to improve its performance as a diffusion barrier against the solder used in the eutectic bonding process. If the electrodes 80 and 92 are omitted, the plating film 112 can be formed by using electrical connections 82 and 94 as seeds. The plating operation is accomplished by an electroless plating process or an electroplating process.

FIG. 40 is a view illustrating still another example of the semiconductor light emitting device according to the present disclosure, in which the plating film 112 formed on the electrode 92 is larger than the plating film 112 formed on the electrode 80.

FIG. 41 is a view illustrating still another example of the semiconductor light emitting device according to the present disclosure, in which a plating film 112 is applied to the semiconductor light emitting device shown in FIG. 3, with the plating film 112 on the electrode 80 being formed higher, thereby resolving the problem of a height difference between the electrode 92 and the electrode 80 during the flip-chip bonding process. One plating process may suffice to match the height of the plating film 112 on the electrode 92 with the height of the plating film 112 on the electrode 80, but, if necessary, the electrode 92 and the electrode 80 may be plated separately.

FIG. 42 is a view illustrating still another example of the semiconductor light emitting device according to the present disclosure, in which one single plating film 112 is applied to the semiconductor light emitting device shown in FIG. 8. This plating film 112 may be formed across the entire electrode 92.

FIG. 43 is a view illustrating still another example of the semiconductor light emitting device according to the present disclosure, in which the semiconductor light emitting device further includes phosphors 220. The phosphor 220, in combination with an epoxy resin, forms an encapsulant 230, and the semiconductor light emitting device is placed at a reflective cup 210. The electrodes 80 and 92 are electrically connected to outside, by means of a conductive adhesive 240 and 250, respectively. The phosphor 220 can be coated conformally as in FIG. 18, or can be applied directly, or can be disposed at a certain distance away from the semiconductor light emitting device. Unlike a lateral chip in a junction-up form where a 50-180 μm thick substrate 50 is usually disposed below thereof, the substrate 50 is disposed below the active layer 40 such that light generated in the active layer 40 cannot be at the center of the reflective cup 210. This may lower the conversion efficiency of the phosphor 220, and the absorption of light by the reflective cup 210 can also become a problem. However, the presence of the plating film 112 shown in FIG. 39 to FIG. 42 can resolve those problems. In this light, the plating film 112 preferably has a thickness of 20 μm or more.

FIG. 44 is a view illustrating a relation among a dielectric film, a DBR and an electrode in the semiconductor light emitting device shown in FIG. 7, in which the dielectric film 91$b$, the DBR 91$a$ and the electrode 92 are deposited in order mentioned. Although a large portion of light generated in the active layer 40 (see FIG. 7, hereinafter) is reflected by the dielectric film 91$b$ and the DBR 91$a$ towards an n-side semiconductor layer 30, part of the light is trapped inside the dielectric film 91$b$ and the DBR 91$a$, or emitted through the lateral faces of the dielectric film 91$b$ and the DBR 91$b$, or absorbed by the electrode 92 made of a metal. The inventors analyzed the relation among the dielectric film 91$b$, the DBR 91$a$ and the electrode 92, in view of an optical waveguide. The optical waveguide is a structure that encloses a propagation part of light by a material having a refractive index lower than that of the propagation part of light and directs the light by total reflection. In this regard, if the DBR 91$a$ can be taken as the propagation part, the dielectric film 91$b$ can be taken as part of the structure that encloses the propagation part. When the DBR 91$a$ is composed of $SiO_2/TiO_2$, with $SiO_2$ having a refractive index of 1.46 and $TiO_2$ having a refractive index of 2.4, the effective refractive index (which denotes an equivalent refractive index of light that can travel in a waveguide made of materials having different refractive indices, and has a value between 1.46 and 2.4) of the DBR 91$a$ is higher than that of the dielectric film 91$b$ composed of $SiO_2$. However, the electrode 92 made of a metal presents on the opposite side, the light absorption may occur as the electrode 92 propagates the light in the lateral direction of the DBR 91$a$.

FIG. 45 is a view illustrating a relation among a dielectric film having an optical waveguide incorporated therein, a DBR and an electrode in the semiconductor light emitting device shown in FIG. 7, in which the dielectric film 91$b$, the DBR 91$a$ and the electrode 92 are deposited in order mentioned, and a light-transmitting film 91$f$ having an effective refractive index lower than that of the DBR 91$a$ is interposed between the DBR 91$a$ and the electrode 92. Preferably, the light-transmitting film 91$f$ has a thickness of at least $\lambda/4n$ (here, $\lambda$ denotes a wavelength of light generated in the active layer 40, and n denotes a refractive index of the material forming the light-transmitting film 91$f$). By way of example, the light-transmitting film 91$l$ can be composed of a dielectric such as $SiO_2$ having a refractive index of 1.46. When $\lambda$ is 450 nm (4500 Å), the light-transmitting film 91$f$ can be formed in a thickness of 771 Å (4500/4×1.46=771 Å) or more. The use of such a material enables to increase the efficiency of an optical waveguide, considering that the efficiency of an optical waveguide increases as the difference between the refractive index of the light-transmitting film 91f and the effective refractive index of the DBR 91a increases. The light-transmitting film 91f is not particularly limited as far as its effective refractive index is lower than that of the DBR 91a, and can be made of a material, for example, metal oxide such as $Al_2O_3$; a dielectric film such as $SiO_2$ or SiON; MgF; CaF or the like. However, if the difference between the refractive indices is small, the light-transmitting film needs to be sufficiently thick to obtain comparable effects. Besides, when the light-transmitting film is formed using $SiO_2$: the efficiency of an optical waveguide can be increased by employing $SiO_2$ having a refractive index lower than 1.46.

FIG. 46 is one example of the semiconductor light emitting device into which the optical waveguide described in FIG. 45 is incorporated. Here, a light-transmitting film 91f having a refractive index lower than the effective refractive index of a DBR 91a is present on the DBR 91a. That is to say, the non-conductive reflective film 91 further includes the light-transmitting film 91f. However, when the light-transmitting film 91f is composed of a conductive material such as a metal oxide, the light-transmitting film 91f does not always constitute part of the non-conductive reflective film 91. It is possible to consider a case where the dielectric film 91b is omitted. Although it is not desirable from the perspective of the optical waveguide, one should not exclude, from the perspective of the overall technical idea of this disclosure, the configuration including the DBR 91a and the light-transmitting film 91f. The electrode 92 may be formed across the entire light-transmitting film 91f, or may be formed on only a part of the light-transmitting film 91f, or may be omitted.

FIG. 47 illustrates a conceptual view of the semiconductor light emitting device to which an optical waveguide according to the present disclosure is applied. Here, the semiconductor light emitting device includes an n-type semiconductor layer 30, an active layer 40, a p-type semiconductor layer 50, a DBR 91a provided on one side of the plurality of semiconductor layers 30, 40 and 50, and two light-transmitting films 91f and 91f having a refractive index lower than that of the DBR 91a due to the presence of the DBR 91a therebetween. The conductivity types of the n-type semiconductor layer 30 and the p-type semiconductor layer 50 may be reversed.

FIG. 48 is a view illustrating another example of the semiconductor light emitting device to which an optical waveguide according to the present disclosure is applied. Here, a metal film 3000 is formed below the light-transmitting film 91f. The metal film 3000 can serve simply as a reflective film, or it can serve as an electrode as well. If the metal film 3000 serves as an electrode, an electrical connection 4000 may be provided when needed, for supplying current to a plurality of semiconductor layers 30, 40 and 50.

FIG. 49 is a view illustrating another example of the semiconductor light emitting device to which an optical waveguide according to the present disclosure is applied. As compared with the semiconductor light emitting device shown in FIG. 48, a light-transmitting substrate or growth substrate 10 is provided between the n-type semiconductor 30 and the light-transmitting film 91f. An electrode 70 is formed on the p-type semiconductor layer 50, and an electrode 80 is formed on the exposed n-type semiconductor layer 30 by etching. The DBR 91a reflects light that is generated in the active layer 40 towards the opposite side of the substrate 10 with respect to the active layer 40, that is, towards the p-type semiconductor layer 50, and forms an optical waveguide with the light-transmitting films 91f and 91f, emitting part of the light to the lateral face thereof.

FIG. 50 is a view illustrating still another example of the semiconductor light emitting device to which an optical waveguide according to the present disclosure is applied. Here, a light-transmitting substrate 10 also serves as a light-transmitting film 91f. For instance, the substrate made of sapphire having a refractive index of about 1.8 and a thickness of 50 μm-180 μm can also serve as a light-transmitting film 91f for the DBR 91a composed of $SiO_2$/$TiO_2$. Here, the light-transmitting film 91f underlying the DBR 91a can be made at the chip level, by depositing a dielectric material such as $SiO_2$, or a metal oxide. As such, it is possible to form the light-transmitting film 91f at the chip level in accordance with the properties of the DBR 91a, and to attach a reflective film 3000 to the light-transmitting film 911 at the chip level.

The following will now describe various embodiments of the present disclosure.

(1) A semiconductor light emitting device, characterized by comprising: a plurality of semiconductor layers that grows sequentially on a growth substrate, with the plurality of semiconductor layers including a first semiconductor layer having a first conductivity, a second semiconductor layer having a second conductivity different from the first conductivity, and an active layer interposed between the first semiconductor layer and the second semiconductor layer, generating light via electron-hole recombination, wherein the plurality of semiconductor layers are grown sequentially using a growth substrate; a first electrode for supplying either electrons or holes to the first semiconductor layer; a non-conductive reflective film formed on the second semiconductor layer, for reflecting light from the active layer towards the first semiconductor layer on the side of the growth substrate; and a finger electrode formed between the plurality of semiconductor layers and the non-conductive reflective film, which is extended to supply, to the second semiconductor layer, either electrons if holes are supplied by the first electrode or holes if the electrons are supplied by the first electrode, which is in electrical communication with the second semiconductor layer, and which has an electrical connection for receiving either electrons or holes. It should be noted that the electrical connection can have a specific configuration as in FIG. 3, and that the finger electrode 92 may create such an electrical connection if the finger electrode 92 comes into a direct contact with the electrode 93.

(2) The semiconductor light emitting device characterized in that the non-conductive reflective film comprises a distributed Bragg reflector.

(3) The semiconductor light emitting device characterized by further comprising: a second electrode connected to the electrical connection, for supplying, to the second semiconductor layer, either electrons if holes are supplied by the first electrode or holes if the electrons are supplied by the first electrode.

(4) The semiconductor light emitting device characterized in that the electrical connection is formed, passing through the non-conductive reflective film from the second electrode to the finger electrode.

(5) The semiconductor light emitting device characterized by further comprising:

an optical absorption barrier formed below the finger electrode and between the plurality of semiconductor layers and the finger electrode, for preventing light generated from the active layer from being absorbed by the finger electrode.

(6) The semiconductor light emitting device characterized in that the optical absorption barrier is composed of a light-transmitting material having a refractive index lower than that of the second semiconductor layer.

(7) The semiconductor light emitting device characterized in that the optical absorption barrier is composed of a non-conductive material.

(8) The semiconductor light emitting device characterized in that the optical absorption barrier is a light-transmitting dielectric film having a refractive index lower than that of the second semiconductor layer.

(9) The semiconductor light emitting device characterized by further comprising: a light-transmitting conductive film formed between the non-conductive reflective layer and the second semiconductor layer, for electrically communicating the finger electrode with the second semiconductor layer.

(10) The semiconductor light emitting device characterized in that the light-transmitting conductive film covers the optical absorption barrier, and the finger electrode overlies the light-transmitting conductive film.

(11) The semiconductor light emitting device characterized in that the light-transmitting conductive film has openings to enable the non-conductive reflective film to come in contact with the plurality of semiconductor layers.

(12) The semiconductor light emitting device characterized in that the finger electrode comes in contact with the optical absorption barrier. As shown in the example of FIG. 10, the light-transmitting conductive film is removed such that the finger electrode comes in direct contact with the optical absorption barrier.

(13) The semiconductor light emitting device characterized in that the non-conductive reflective film comprises a dielectric film underlying the distributed bragg reflector and having a refractive index lower than that of the second semiconductor layer.

(14) The semiconductor light emitting device characterized in that the second semiconductor layer is composed of a p-type group III nitride semiconductor. The present disclosure is particularly suitable for a group III nitride semiconductor known to have a poor current diffusion capacity of the p-type GaN and to get assisted by a light-transmitting conductive film (e.g., ITO).

(15) The semiconductor light emitting device characterized in that the finger electrode overlies the light-transmitting conductive film.

(16) The semiconductor light emitting device characterized in that the first electrode comprises a finger electrode which extends from the first electrode along the first semiconductor layer.

(17) A process for manufacturing a semiconductor light emitting device, characterized by comprising: preparing a plurality of semiconductor layers that grows sequentially using a growth substrate, with the plurality of semiconductor layers including a first semiconductor layer having a first conductivity, a second semiconductor layer having a second conductivity different from the first conductivity, and an active layer interposed between the first semiconductor layer and the second semiconductor layer, generating light via electron-hole recombination: forming a finger electrode to enable electrical communication with the second semiconductor layer; forming, on the finger electrode, a non-conductive reflective film composed of a multi-layer dielectric film, for reflecting light from the active layer towards the first semiconductor layer on the growth substrate side, wherein the non-conductive reflective film is formed such that a bottom layer obtained by chemical vapor deposition has a thickness greater than the thickness of each of two or more layers obtained by physical vapor deposition to be deposited on the bottom layer; and forming an electrical connection, passing through the non-conductive reflective film and being electrically connected to the finger electrode. An expanded scope of the manufacturing process according to the present disclosure, in which finger electrodes are omitted from the semiconductor light emitting device.

(18) The process for manufacturing a semiconductor light emitting device characterized in that the chemical vapor deposition is plasma enhanced chemical vapor deposition.

(19) The process for manufacturing a semiconductor light emitting device characterized in that the physical vapor deposition is any one selected from electron beam deposition and sputtering.

(20) The process for manufacturing a semiconductor light emitting device characterized in that the bottom layer comprises $SiO_2$.

(21) The process for manufacturing a semiconductor light emitting device characterized in that at least two layers comprise $TiO_2$.

(22) The process for manufacturing a semiconductor light emitting device characterized in that at least two layers comprise a distributed bragg reflector composed of $SiO_2$ and $TiO_2$.

(23) The process for manufacturing a semiconductor light emitting device characterized by further comprising: forming, on the non-conductive reflective film, a metal layer to be connected with the electrical connection. The metal layer can be either an electrode 92, or an auxiliary heat-dissipating pad 97 connected to the electrode 92.

(24) The process for manufacturing a semiconductor light emitting device characterized by further comprising, prior to the step of forming a non-conducive reflective film, forming an electrode on the exposed, first semiconductor layer by etching.

(25) The process for manufacturing a semiconductor light emitting device characterized in that, in the step of forming a finger electrode, the top layer of the finger electrode is formed of a metal other than Au.

(26) The process for manufacturing a semiconductor light emitting device characterized in that, in the step of forming a finger electrode, the top layer of the finger electrode is formed of a metal selected from Ni, Ti, W, TiW, Cr, Pd and Mo.

(27) A semiconductor light emitting device, characterized by comprising: a plurality of semiconductor layers that grows sequentially on a growth substrate, with the plurality of semiconductor layers including a first semiconductor layer having a first conductivity, a second semiconductor layer having a second conductivity different from the first conductivity, and an active layer interposed between the first semiconductor layer and the second semiconductor layer, generating light via electron-hole recombination; a first electrode supplying either electrons or holes to the first semiconductor layer; a second electrode supplying, to the second semiconductor layer, electrons if the holes are supplied by the first electrode, or holes if the electrons are supplied by the first electrode; and a non-conductive reflective film formed on the second semiconductor layer, for reflecting light from the active layer towards the first semiconductor layer on the side of the growth substrate, wherein the non-conductive reflective layer includes a distributed bragg reflector which comprises a first layer having a first refractive index ($n_1$) and a second layer having a second refractive index ($n_2$) greater than the first refractive index, with the first and second layers being laminated in an alternate manner, the second layer having a thickness designed for a longer wavelength than the wavelength based on which the first layer is designed. The first semiconductor layer can have an n-type conductivity, and the second semiconductor layer can have a p-type conductivity, and vice versa. The first electrode can have the same form as the electrode 80 in FIG. 3 and the electrode 83 in FIG. 8. When the substrate 10 is removed, the first electrode can adopt a variety of forms that can be formed directly on the first semiconductor layer. The second electrode can adopt a variety of forms, in addition to the form of the electrode 92 in FIG. 3 and/or the electrical connection 94.

(28) A semiconductor light emitting device, characterized by comprising: a plurality of semiconductor layers that grows sequentially on a growth substrate, with the plurality of semiconductor layers including a first semiconductor layer having a first conductivity, a second semiconductor layer having a second conductivity different from the first conductivity, and an active layer interposed between the first semiconductor layer and the second semiconductor layer, generating light via electron-hole recombination; a light-transmitting conductive film formed on the second semiconductor layer; a first non-conductive reflective film formed on the light-transmitting conductive film, for reflecting light from the active layer towards the first semiconductor layer; a first electrode, which supplies either electrons or holes to the plurality of semiconductor layers and is electrically connected to the first semiconductor layer; a second electrode overlying the first non-conductive reflective film, which supplies, to the plurality of semiconductor layers, electrons if the holes are supplied by the first electrode, or holes if the electrons are supplied by the first electrode, and is electrically connected to the second semiconductor layer; an electrical connection, passing through the first non-conductive reflective film and connecting the second electrode to the light-transmitting conductive film; and a second non-conductive reflective film interposed between the second semiconductor layer and the light-transmitting conductive film below the electrical connection, for reflecting light from the active layer towards the first semiconductor layer. The first semiconductor layer can have an n-type conductivity, and the second semiconductor layer can have a p-type conductivity, and vice versa. The first electrode can have the same form as the electrode 80 in FIG. 3 and the electrode 83 in FIG. 8. When the substrate 10 is removed, the first electrode can adopt a variety of forms that can be formed directly on the first semiconductor layer. The second electrode can adopt a variety of forms, in addition to the form of the electrode 92 in FIG. 3 and/or the electrical connection 94.

(29) A semiconductor light emitting device, characterized by comprising: a growth substrate; a plurality of semiconductor layers that grows sequentially on the growth substrate, with the plurality of semiconductor layers including a first semiconductor layer having a first conductivity, a second semiconductor layer having a second conductivity different from the first conductivity, and an active layer interposed between the first semiconductor layer and the second semiconductor layer, generating light via electron-hole recombination; a non-conductive reflective film formed on the second semiconductor layer and extended up to a lateral face of the growth substrate, for reflecting light from the active layer towards the first semiconductor layer on the side of the growth substrate; a first electrode supplying either electrons or holes to the plurality of semiconductor layers; and a second electrode supplying, to the plurality of semiconductor layers, electrons if the holes are supplied by the first electrode, or holes if the electrons are supplied by the first electrode.

(30) A semiconductor light emitting device, characterized by comprising: a plurality of semiconductor layers that grows sequentially on a growth substrate, with the plurality of semiconductor layers including a first semiconductor layer having a first conductivity, a second semiconductor layer having a second conductivity different from the first conductivity, and an active layer interposed between the first semiconductor layer and the second semiconductor layer, generating light via electron-hole recombination; a non-conductive reflective film formed on the second semiconductor layer, for reflecting light from the active layer towards the first semiconductor layer on the side of the growth substrate; a first electrode supplying either electrons or holes to the plurality of semiconductor layers; a second electrode supplying, to the plurality of semiconductor layers, electrons if the holes are supplied by the first electrode, or holes if the electrons are supplied by the first electrode, wherein at least one of the first and second electrodes is provided on the opposite side of the plurality of semiconductor layers with respect to the non-conductive reflective layer; and a plating film attached to the at least one of the first and second electrodes, wherein the plating film is provided on the opposite side of the plurality of semiconductor layers with respect to the non-conductive reflective layer.

(31) A semiconductor light emitting device, characterized by comprising: a plurality of semiconductor layers that grows sequentially on a growth substrate, with the plurality of semiconductor layers including a first semiconductor layer having a first conductivity, a second semiconductor layer having a second conductivity different from the first conductivity, and an active layer interposed between the first semiconductor layer and the second semiconductor layer, generating light via electron-hole recombination; a first electrode supplying either electrons or holes to the plurality of semiconductor layers; a second electrode supplying, to the plurality of semiconductor layers, electrons if the holes are supplied by the first electrode, or holes if the electrons are supplied by the first electrode; a non-conductive reflective film, which is formed on the second semiconductor layer, for reflecting light from the active layer towards the first semiconductor layer on the side of the growth substrate and includes a dielectric film and a distributed bragg reflector in order mentioned from the second semiconductor layer; and a light-transmitting film formed on the distributed bragg reflector as part of or separately from the non-conductive reflective film, wherein the light-transmitting film has a refractive index lower than an effective refractive index of the distributed bragg reflector.

(32) A semiconductor light emitting device characterized by comprising: a plurality of semiconductor layers that grows sequentially on a growth substrate, with the plurality of semiconductor layers including a first semiconductor layer having a first conductivity, a second semiconductor layer having a second conductivity different from the first conductivity, and an active layer interposed between the first semiconductor layer and the second semiconductor layer, generating a light with a first wavelength via electron-hole recombination; a first electrode, supplying either electrons or holes to the plurality of semiconductor layers; a second electrode, supplying, to the plurality of semiconductor layers, electrons if the holes are supplied by the first electrode, or holes if the electrons are supplied by the first electrode; a phosphor part provided over the first semiconductor layer on the side of the growth substrate, converting the light with the first wavelength generated in the active layer into a light of a second wavelength; and a non-conductive reflective film formed on the second semiconductor layer for reflecting the light from the active layer towards the first semiconductor layer on the side of the growth substrate, wherein the non-conductive reflective film has a distributed bragg reflector designed based on the light converted by the phosphor part.

(33) The semiconductor light emitting device characterized in that the phosphor part converts the light of the first wavelength into n wavelengths (n is an integer of at least 2) including the second wavelength, and that the non-conductive reflective film has at least two distributed bragg reflectors designed based on two or more lights selected from the group consisting of light from the active layer and light from the phosphor part.

(34) The semiconductor light emitting device characterized in that the at least two distributed bragg reflectors include a distributed bragg reflector designed based on the light from the active layer.

(35) The semiconductor light emitting device characterized in that the at least two distributed bragg reflectors are arranged in order of shortest reference wavelength to longest designed from the second semiconductor layer.

(36) The semiconductor light emitting device characterized in that the at least two distributed bragg reflectors are arranged in order of longest reference wavelength to shortest designed from the second semiconductor layer.

(37) The semiconductor light emitting device characterized in that the n wavelengths include the second wavelength, a third wavelength and a fourth wavelength, wherein the third and fourth wavelengths has the smallest difference therebetween among the three wavelengths, and that the non-conductive reflective film has one distributed bragg reflector for the third and fourth wavelengths.

(38) The semiconductor light emitting device characterized in that the at least two reflectors have a distributed bragg reflector designed based on two wavelengths converted by the phosphor part.

(39) The semiconductor light emitting device characterized in that said two wavelengths are ones having the smallest difference in wavelength among the wavelengths converted by the phosphor part.

(40) The semiconductor light emitting device characterized in that said two wavelengths are ones having the two longest wavelengths among wavelengths converted by the phosphor part.

(41) The semiconductor light emitting device characterized in that the second electrode comprises a finger electrode interposed between the non-conductive reflective film and the second semiconductor layer.

(42) The semiconductor light emitting device characterized in that the second electrode contains Au on the side facing the second semiconductor layer.

(43) The semiconductor light emitting device characterized in that at least two distributed bragg reflectors include a distributed bragg reflector designed based on light from the active layer, and that a non-conductive reflective film comprises a dielectric film having a refractive index lower than that of the second semiconductor layer below the distributed bragg reflector.

(44) The semiconductor light emitting device characterized in that the second electrode comprises a finger electrode interposed between the dielectric film and the second semiconductor layer.

(45) The semiconductor light emitting device characterized in that the semiconductor is a Group III nitride semiconductor.

According to one semiconductor light emitting device according to the present disclosure, it is possible to realize a new form of a reflective film structure.

According to another semiconductor light emitting device according to the present disclosure, it is possible to realize a new form of a flip-chip.

According to still another semiconductor light emitting device according to the present disclosure, it is possible to realize a reflective film structure that incorporates finger electrodes.

According to yet another semiconductor light emitting device according to the present disclosure, it is possible to embody a flip-chip that incorporates a finger electrode.

What is claimed is:

1. A semiconductor light emitting device comprising:
    a plurality of semiconductor layers including a first semiconductor layer having a first conductivity, a second semiconductor layer having a second conductivity different from the first conductivity, and an active layer interposed between the first semiconductor layer and the second semiconductor layer and generating light via electron-hole recombination, wherein a portion of the first semiconductor layer is exposed by etching the active layer and the second semiconductor layer;
    a single non-conductive reflective film provided on the plurality of semiconductor layers for reflecting the light from the active layer towards the first semiconductor layer wherein the single non-conductive reflective film includes a distributed bragg reflector;
    first and second electrodes provided on and in contact with the single non-conductive reflective film, and electrically connected with the plurality of semiconductor layers, the single non-conducive reflective film provided between the plurality of semiconductor layers and the first and second electrodes;
    at least one finger electrode extended between the single non-conductive reflective film and the plurality of semiconductor layers;
    an electrical connection passing through the single non-conductive reflective film and from the first electrode to said portion of the first semiconductor layer, the single non-conducive reflective film having a same height on both a side where the first electrode is provided and a side where the second electrode is provided;
    an additional finger electrode electrically connected to the second electrode and extended between the single non-conductive reflective film and the second semiconductor layer; and
    an additional electrical connection passing through the single non-conductive reflective film and from the second electrode to the additional finger electrode,
    wherein the first semiconductor layer is provided opposite to the single non-conductive reflective film with respect to the second semiconductor layer,
    wherein the at least one finger electrode is provided on the exposed portion of the first semiconductor layer where the second semiconductor layer and the active layer are removed,
    wherein the at least one finger electrode is electrically connected to the first electrode,
    wherein the at least one finger electrode is extended on the first semiconductor layer toward the second electrode,
    wherein the at least one finger electrode and the portion of the first semiconductor layer are covered and contacted with the non-conductive reflective film,
    wherein the first electrode in contact with the single non-conductive reflective film is positioned over an upper face of the single non-conductive reflective film with a portion of the second semiconductor layer located below the first electrode, while the at least one finger electrode extended on the first semiconductor layer toward the second electrode is not positioned over the second semiconductor layer, and wherein the whole of the at least one finger electrode and the whole of the additional finger electrode are covered by the single non-conductive reflective film.

2. The semiconductor light emitting device claimed in claim 1, wherein the at least one finger electrode is extended under the second electrode and the additional finger electrode is extended under the first electrode.

3. The semiconductor light emitting device claimed in claim 1, wherein the at least one finger electrode is composed of two or more separate finger electrodes.

4. The semiconductor light emitting device claimed in claim 1, wherein the at least one finger electrode are composed of a plurality of finger electrodes which are extended along a lateral direction of the device.

* * * * *